(12) United States Patent
Kim

(10) Patent No.: US 12,374,248 B2
(45) Date of Patent: Jul. 29, 2025

(54) PIXEL AND DISPLAY DEVICE INCLUDING THE SAME

(71) Applicant: SAMSUNG DISPLAY CO., LTD., Yongin-si (KR)

(72) Inventor: Keun Woo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/156,800

(22) Filed: Jan. 19, 2023

(65) Prior Publication Data

US 2023/0386376 A1 Nov. 30, 2023

(30) Foreign Application Priority Data

May 31, 2022 (KR) .................. 10-2022-0067181

(51) Int. Cl.
G09G 3/00 (2006.01)
G09G 3/3233 (2016.01)
H01L 25/16 (2023.01)

(52) U.S. Cl.
CPC ........... *G09G 3/006* (2013.01); *G09G 3/3233* (2013.01); G09G 2300/0819 (2013.01); G09G 2300/0852 (2013.01); G09G 2300/0861 (2013.01); G09G 2310/08 (2013.01); G09G 2320/0233 (2013.01); G09G 2330/021 (2013.01); G09G 2330/12 (2013.01); H01L 25/167 (2013.01)

(58) Field of Classification Search
CPC .............. G09G 3/006; G09G 3/3233; G09G 2300/0852; G09G 2300/0819; G09G 2300/0861; G09G 2310/08; G09G 2320/0233; G09G 2330/021; G09G 2330/12; H01L 25/167
USPC ................................................ 345/690, 76
See application file for complete search history.

(56) References Cited

U.S. PATENT DOCUMENTS

| | | | |
|---|---|---|---|
| 2012/0019504 A1* | 1/2012 | Han | G09G 3/3233 345/212 |
| 2021/0248961 A1* | 8/2021 | Yang | G09G 3/3233 |
| 2021/0280652 A1 | 9/2021 | Kim et al. | |
| 2022/0069044 A1* | 3/2022 | Kwak | G09G 3/3291 |

FOREIGN PATENT DOCUMENTS

| | | |
|---|---|---|
| KR | 1020180062585 A | 6/2018 |
| KR | 1020210113513 A | 9/2021 |

* cited by examiner

*Primary Examiner* — Jimmy H Nguyen
(74) *Attorney, Agent, or Firm* — CANTOR COLBURN LLP

(57) ABSTRACT

A pixel includes: a light emitting element; a first transistor including a first electrode connected to a first power line, to which a voltage of the first power supply is supplied, where the first transistor controls, in response to a voltage of a first node connected to a gate electrode thereof, current flowing from the first power line to a second power line, to which a voltage of a second power supply is supplied, via the light emitting element; a second transistor connected between a data line and a second node, where the second transistor is turned on when a first scan signal is supplied thereto through a first scan line; a first capacitor connected between the first node and the second node; and a connector electrically connected between the first node to the second node.

12 Claims, 13 Drawing Sheets

T3: T3_1, T3_2
T4: T4_1, T4_2

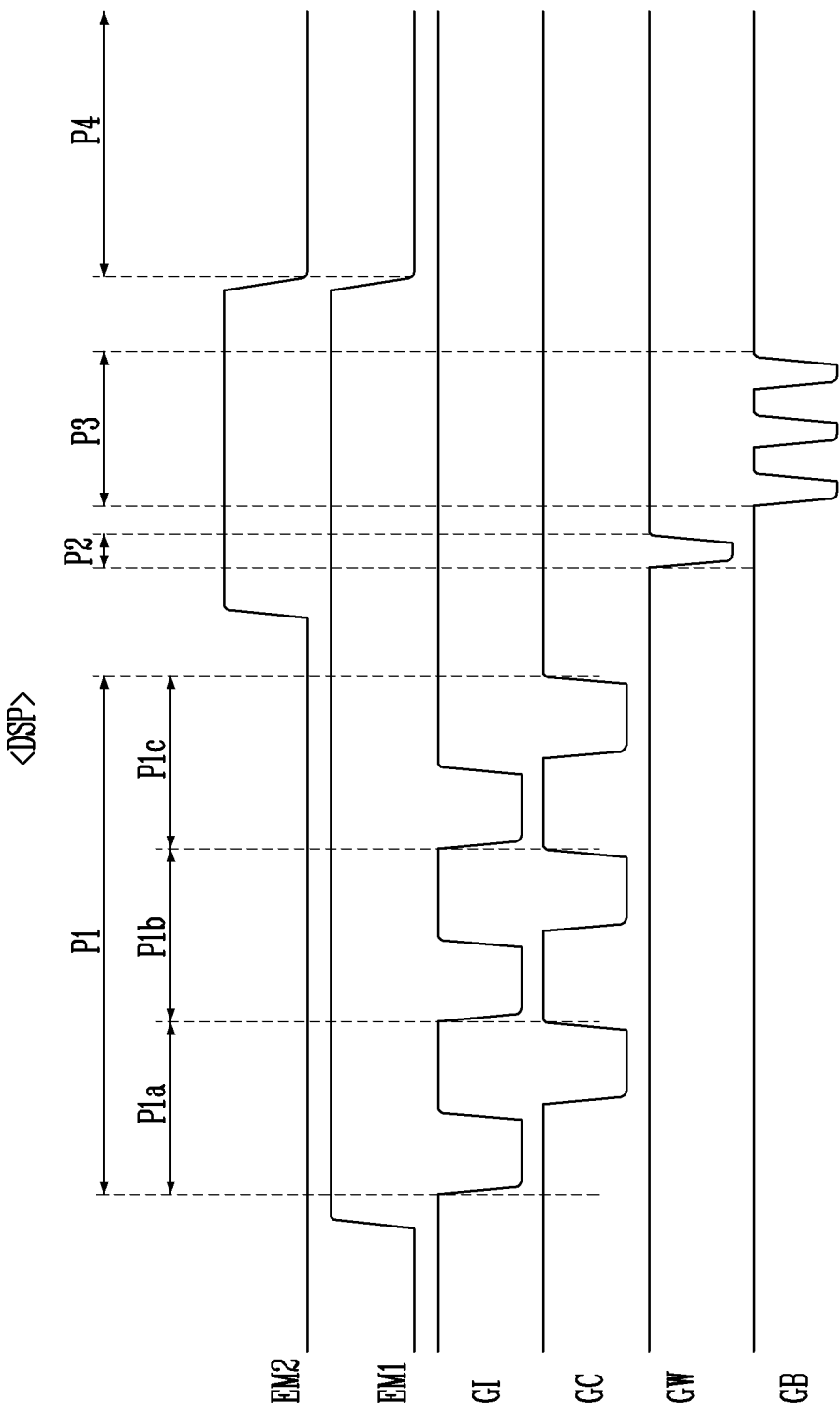

<SSP>

T2: T2_1, T2_2
T3: T3_1, T3_2
T4: T4_1, T4_2
T5: T5_1, T5_2

T2: T2_1, T2_2
T3: T3_1, T3_2
T4': T4_1', T4_2'
T5: T5_1, T5_2

PIXEL AND DISPLAY DEVICE INCLUDING THE SAME

This application claims priority to Korean patent application number 10-2022-0067181, filed on May 31, 2022, and all the benefits accruing therefrom under 35 U.S.C. § 119, the content of which in its entirety is herein incorporated by reference.

BACKGROUND

1. Field

Various embodiments of the disclosure relate to a pixel and a display device including the pixel.

2. Description of Related Art

With the development of information technology, the importance of a display device, which is a connection medium between a user and information, has been emphasized. Accordingly, various kinds of display devices, such as a liquid crystal display device and an organic light-emitting display device, are widely used in various fields.

The display device may use a plurality of pixels to display an image. Recently, to enhance the driving efficiency of the display device and minimize the power consumption thereof, a method of driving the display device at a low frequency has been used, and pixels having various structures corresponding thereto have been proposed. Here, to improve the yield of display devices, a pixel is desired to have a structure configured to easily detect whether a defect is during a production process.

SUMMARY

Various embodiments of the disclosure are directed to a pixel having a structure configured to easily detect whether a defect is present, and a display device including the pixel.

An embodiment of the disclosure provides a pixel including: a light emitting element; a first transistor including a first electrode connected to a first power line, to which a voltage of the first power supply is supplied, where the first transistor controls, in response to a voltage of a first node connected to a gate electrode thereof, current flowing from the first power line to a second power line, to which a voltage of a second power supply is supplied, via the light emitting element; a second transistor connected between a data line and a second node, where the second transistor is turned on when a first scan signal is supplied thereto through a first scan line; a first capacitor connected between the first node and the second node; and a connector connected between the first node to the second node.

In an embodiment, the pixel may further include: a third transistor including a plurality of first sub-transistors connected in series between the second node and a third power line, to which a voltage of a reference power supply is supplied, where the plurality of first sub-transistors is turned on when a second scan signal is supplied thereto through a second scan line; and a fourth transistor including a plurality of second sub-transistors connected in series between the first node and a fourth power line, to which a voltage of a first initialization power supply is supplied, where the plurality of second sub-transistors is turned on when a third scan signal is supplied thereto through a third scan line.

In an embodiment, the connector may include a connection line electrically connected to a third node between the first sub-transistors and to a fourth node between the second sub-transistors.

In an embodiment, during a test process of the pixel, a turn-on period of the third transistor may at least partially overlap a turn-on period of the fourth transistor.

In an embodiment, the pixel may further include: a fifth transistor connected between the first node and a second electrode of the first transistor, where the fifth transistor is turned on when the second scan signal is supplied thereto; a sixth transistor connected between the second electrode of the first transistor and an anode electrode of the light emitting element, where the sixth transistor is turned off when a first emission control signal is supplied thereto through a first emission control line; a seventh transistor connected between the first power line and the first electrode of the first transistor, where the seventh transistor is turned off when a second emission control signal is supplied thereto through a second emission control line; an eighth transistor connected between the anode electrode of the light emitting element and a fifth power line, to which a voltage of a second initialization power line is supplied, where the eighth transistor is turned on when a fourth scan signal is supplied to a fourth scan line; and a ninth transistor connected between the first electrode of the first transistor and a sixth power line, to which a voltage of a bias power supply is supplied, where the ninth transistor is turned on when the fourth scan signal is supplied thereto.

In an embodiment, the voltage of the first initialization power supply and the voltage of the second initialization power supply may be the same as each other.

In an embodiment, each of the second transistor and the fifth transistor may include a plurality of transistors connected in series to each other.

In an embodiment, the pixel may further include a second capacitor connected between the first power line and the second node.

In an embodiment, the pixel may further include a second capacitor connected between the first power line and the first node.

In an embodiment, the connector may include a connection line electrically connected to a fourth node between the second sub-transistors and to the second node.

In an embodiment, the connector may include a tenth transistor connected between the first node and the second node, wherein the tenth transistor is turned on when a fifth scan signal is supplied thereto through a fifth scan line.

In an embodiment, the tenth transistor may be turned on during a test process of the pixel, and may be turned off during a period other than the test process.

An embodiment of the disclosure provides a display device including: pixels connected to scan lines, emission control lines, data lines, and power lines. In such an embodiment, each of the pixels includes: a light emitting element; a first transistor including a first electrode connected to a first power line, to which a voltage of the first power supply is supplied, where the first transistor controls, in response to a voltage of a first node connected to a gate electrode thereof, current flowing from the first power line to a second power line, to which a voltage of a second power supply is supplied, via the light emitting element; a second transistor connected between a data line and a second node, where the second transistor is turned on when a first scan signal is supplied thereto through a first scan line; a first capacitor connected between the first node and the second node; and a connector connected between the first node and the second node.

In an embodiment, each of the pixels may further include: a third transistor including a plurality of first sub-transistors connected in series between the second node and a third power line, to which a voltage of a reference power supply is supplied, where the plurality of first sub-transistors is turned on when a second scan signal is supplied thereto through a second scan line; and a fourth transistor including a plurality of second sub-transistors connected in series between the first node and a fourth power line, to which a voltage of a first initialization power supply is supplied, where the plurality of second sub-transistors is turned on when a third scan signal is supplied thereto through a third scan line.

In an embodiment, the connector may include a connection line electrically connected to a third node between the first sub-transistors and to a fourth node between the second sub-transistors.

In an embodiment, the connector may include a connection line electrically connected to a fourth node between the second sub-transistors and to the second node.

In an embodiment, the connector may include a tenth transistor connected between the first node and the second node, where the tenth transistor is turned on when a fifth scan signal is supplied thereto through a fifth scan line.

In an embodiment, the tenth transistor may be turned on during a test process of the pixel and turned off during a period other than the test process.

In an embodiment, each of the pixels may further include: a fifth transistor connected between the first node and a second electrode of the first transistor, where the fifth transistor is turned on when the second scan signal is supplied thereto; a sixth transistor connected between the second electrode of the first transistor and an anode electrode of the light emitting element, where the sixth transistor is turned off when a first emission control signal is supplied thereto through a first emission control line; a seventh transistor connected between the first power line and the first electrode of the first transistor, where the seventh transistor is turned off when a second emission control signal is supplied thereto through a second emission control line; an eighth transistor connected between the anode electrode of the light emitting element and a fifth power line, to which a voltage of a second initialization power line is supplied, where the eighth transistor is turned on when a fourth scan signal is supplied thereto through a fourth scan line; and a ninth transistor connected between the first electrode of the first transistor and a sixth power line, to which a voltage of a bias power supply is supplied, where the ninth transistor is turned on when the fourth scan signal is supplied thereto.

In an embodiment, each of the pixels may further include a second capacitor connected between the first power line and the second node or between the first power line and the first node.

BRIEF DESCRIPTION OF THE DRAWINGS

FIG. 5 is a waveform diagram for describing an embodiment of the operation of the pixel during a display scan period of one frame.

DETAILED DESCRIPTION

Figure 1:
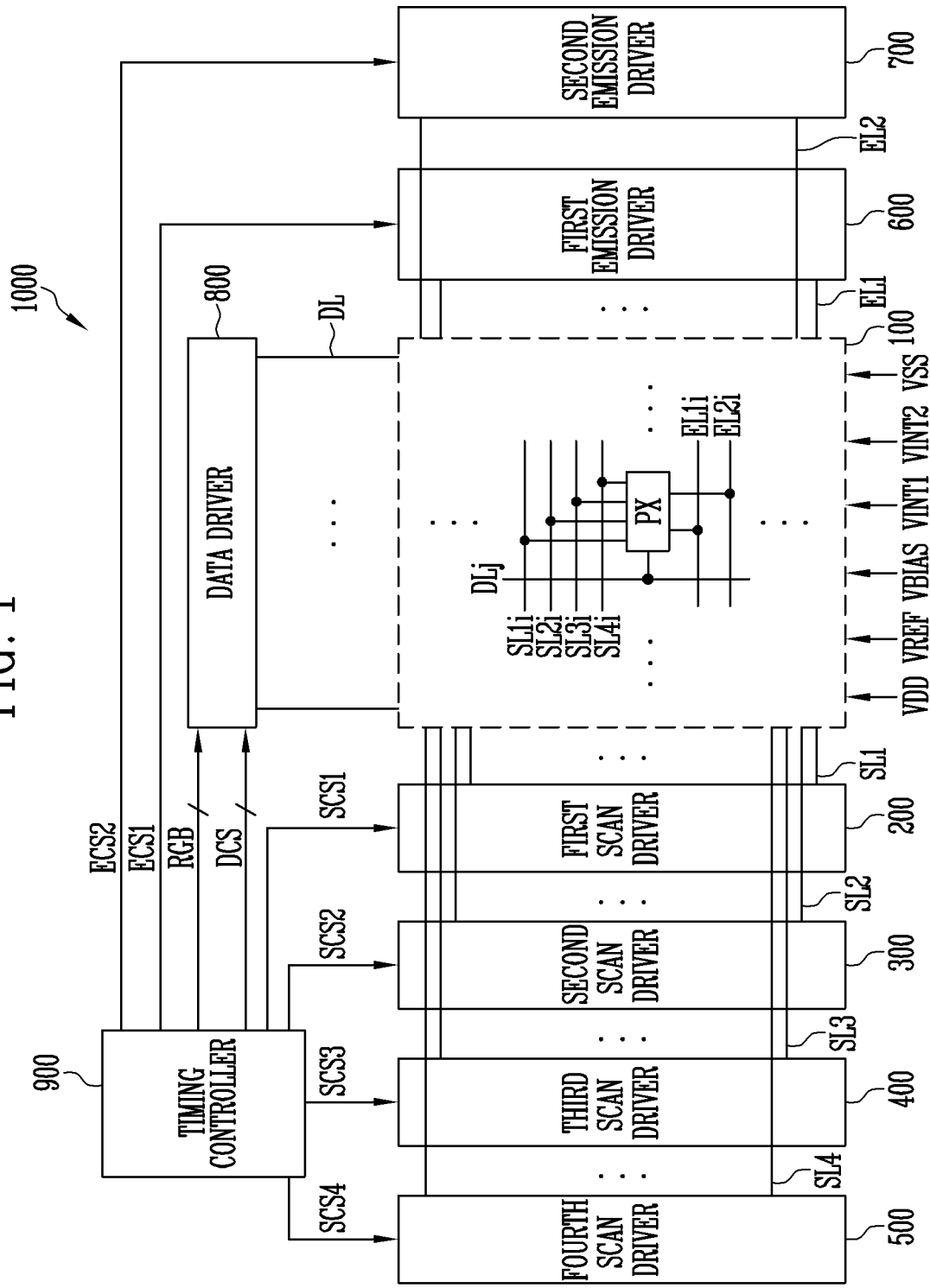
FIG. 1 is a diagram illustrating a display device in accordance with an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

For reference, the size of each component and the thicknesses of lines illustrating the component may be arbitrarily represented for the sake of description, and the disclosure is not limited to what is illustrated in the figures. In the drawings, the thicknesses of the components may be exaggerated to clearly depict multiple layers and areas. Thus, regions illustrated in the figures are schematic in nature and their shapes are not intended to illustrate the precise shape of a region and are not intended to limit the scope of the claims Furthermore, the expression "being the same" may mean "being substantially the same". In other words, the expression "being the same" may include a range that can be tolerated by those skilled in the art. The other expressions may also be expressions from which the term "substantially" has been omitted.

Hereinafter, embodiments of the invention will be described in detail with reference to the accompanying drawings.

FIG. 1 is a diagram illustrating a display device 1000 in accordance with an embodiment of the disclosure.

Referring to FIG. 1, the display device 1000 in accordance with an embodiment of the disclosure may include a pixel component 100, a scan driver 200, 300, 400, and 500, an emission driver 600 and 700, a data driver 800, and a timing controller 900.

In an embodiment, the display device 1000 may further include a power supply configured to supply, to the pixel component 100, a voltage of a first power supply VDD, a voltage of a second power supply VSS, a voltage of a first initialization power supply VINT1, a voltage of a second initialization power supply VINT2, a voltage of a reference power supply VREF, and a voltage of a bias power supply VBIAS. The power supply may supply a gate-on voltage and a gate-off voltage of a scan signal and/or an emission control signal to the scan driver 200, 300, 400, and 500 and/or the emission driver 600 and 700. The foregoing structure is only for illustrative purposes. At least one selected from the first power supply VDD, the second power supply VSS, the first initialization power supply VINT1, the second initialization power supply VINT2, the reference power supply VREF, and the bias power supply VBIAS may be supplied from the data driver 800 or the timing controller 900.

In an embodiment, the first power supply VDD and the second power supply VSS may be used to drive a light emitting element. In such an embodiment, the voltage of the first power supply VDD may be set to a level higher than the voltage of the second power supply VSS. In an embodiment, for example, the voltage of the first power supply VDD may be a positive voltage, and the voltage of the second power supply VSS may be a negative voltage.

The first initialization power supply VINT1 and the second initialization power supply VINT2 may be power supplies for initializing the pixel PX. In an embodiment, for example, a driving transistor included in the pixel PX may be initialized by a voltage of the first initialization power supply VINT1. An anode electrode of the light emitting element may be initialized by a voltage of the second initialization power supply VINT2. The first initialization power supply VINT1 may be set to a voltage lower than a data signal. The second initialization power supply VINT2 may be set to a voltage identical to or different from that of the first initialization power supply VINT1 depending to the resolution or size of a panel to be used. In an embodiment where the first initialization power supply VINT1 and the initialization power supply VINT2 are set to the same voltage, the second initialization power supply VINT2 may be replaced with the first initialization power supply VINT1.

The reference power supply VREF may be a power supply for initializing the pixel PX. In an embodiment, for example, the capacitor and/or transistor included in the pixel PX may be initialized by a voltage of the reference power supply VREF. The voltage of the reference power supply VREF may be a positive voltage. In an embodiment, for example, the reference power supply VREF may have a same voltage level as that of the first power supply VDD, but the disclosure is not limited thereto.

The bias power supply VBIAS may be a power supply for supplying a certain bias to the source and/or drain electrode of the driving transistor included in the pixel PX. In an embodiment, for example, although the bias power supply VBIAS may be set to a positive voltage such that the driving transistor is allowed to be set to an on-bias state, but the disclosure is not limited thereto. The bias power supply VBIAS may be set to various voltages such that the characteristics of the driving transistor remain constant. In an embodiment, for example, the voltage of the bias power supply VBIAS may be experimentally determined in response to the resolution, the size, and the like of a display panel.

The display device 1000 may display images at various image refresh rates (or various driving frequencies) depending on driving conditions. An image refresh rate may refer to a frequency at which data signals are written to the driving transistor of the pixel PX. In an embodiment, for example, the image refresh rate may also be referred to as "scan rate" or "refresh frequency" and indicate the number of images displayed per second.

In an embodiment, for each horizontal line (or each pixel row), the output frequency of the data driver 800 and/or the output frequency of the first scan driver 200 which may output a first scan signal (or a write scan signal) may be determined in response to the image refresh rate. In an embodiment, for example, the refresh rate for driving a video may be a frequency of about 60 hertz (Hz) or more (e.g., about 120 Hz, or about 240 Hz).

In an embodiment, the display device 1000 may adjust, depending on driving conditions, an output frequency of the scan drivers 200, 300, 400, and 500 for each horizontal line (or each pixel row) and an output frequency of the data driver 800 corresponding thereto. In an embodiment, for example, the display device 1000 may display images in response to various image refresh rates in a range from 1 Hz to 240 Hz. However, this is only for illustrative purposes. In an alternative embodiment, for example, the display device 1000 may display images at an image refresh rate (e.g., 480 Hz) greater than 240 Hz.

The pixel component 100 may include pixels PX which are connected to data lines DL, scan lines SL1, SL2, SL3, and SL4, and emission control lines EL1 and EL2. The pixels PX may be supplied with the voltage of the first power supply VDD, the voltage of the second power supply VSS, the voltage of the first initialization power supply VINT1, the voltage of the second initialization power supply VINT2, the voltage of the reference power supply VREF, and the voltage of the bias power supply VBIAS. In an embodiment, the pixel PX that is disposed on an i-th row (i is a natural number) and a j-th column (j is a natural number) may be connected (or coupled) to scan lines SL1i, SL2i, SL3i, and SL4i that correspond to an i-th pixel row, emission control lines EL1i and EL2i that correspond to the i-th pixel row, and a data line DLj that corresponds to a j-th pixel column. In an embodiment of the disclosure, signal lines SL1, SL2, SL3, SL4, EL1, EL2, and DL connected to the pixel PX may be set in various forms in response to a circuit structure of the pixel PX.

The scan driver 200, 300, 400, and 500 may be divided into a first scan driver 200, a second scan driver 300, a third scan driver 400, and a fourth scan driver 500 by configuration and operation. The division of the scan driver is for convenience of explanation, and at least some of the scan drivers may be integrated into a single driving circuit, module, or the like.

The first scan driver 200 may supply first scan signals to first scan lines SL1 in response to a first driving control signal SCS1 supplied from the timing controller 900. In an embodiment, for example, the first scan driver 200 may successively supply the first scan signals to the first scan lines SL1. When the first scan signals are successively supplied, the pixels PX may be selected on a horizontal line basis (i.e., on a pixel row basis), and data signals may be supplied to the pixels PX. In other words, the first scan signals each may be a signal to be used to write data. The first scan signal may be set to a gate-on voltage (e.g., a low level). A transistor that is included in the pixel PX and configured to receive the first scan signal may be turned or set to a turned-on state when the first scan signal is supplied thereto.

In an embodiment, the first scan driver 200 may supply the first scan signal at a same frequency as a refresh rate of the display device 1000 to one scan line (e.g., the i-th scan line SL1i) of the first scan lines SL1.

The first scan driver 200 may supply scan signals to the first scan lines SL1 during a display scan period of each frame. In an embodiment, for example, the first scan driver 200 may supply at least one first scan signal to each of the first scan lines SL1 during the display scan period.

The second scan driver 300 may supply second scan signals to second scan lines SL2 in response to a second driving control signal SCS2 supplied from the timing controller 900. In an embodiment, for example, the second scan driver 300 may successively supply the second scan signals to the second scan lines SL2. The second scan signals may be supplied to initialize the pixels PX and/or compensate for a threshold voltage (Vth) of the driving transistor of each pixel PX. The second scan signal may be set to a gate-on voltage (e.g., a low level). A transistor that is included in the pixel PX and configured to receive the second scan signal may be set to a turned-on state when the second scan signal is supplied thereto.

The second scan driver 300 may supply second scan signals to the second scan lines SL2 during a display scan period of each frame. In an embodiment, for example, the second scan driver 300 may supply at least one second scan signal to each of the second scan lines SL2 during the display scan period.

The third scan driver 400 may supply third scan signals to third scan lines SL3 in response to a third driving control signal SCS3 supplied from the timing controller 900. In an embodiment, for example, the third scan driver 400 may successively supply the third scan signals to the third scan lines SL3. The third scan signals may be supplied to initialize the driving transistors included in the pixels PX. The third scan signal may be set to a gate-on voltage (e.g., a low level). A transistor that is included in the pixel PX and configured to receive the third scan signal may be set to a turned-on state when the third scan signal is supplied thereto.

The third scan driver 400 may supply third scan signals to the third scan lines SL3 during a display scan period of each frame. In an embodiment, for example, the third scan driver 400 may supply at least one third scan signal to each of the third scan lines SL3 during the display scan period.

The fourth scan driver 500 may supply fourth scan signals to fourth scan lines SL4 in response to a fourth driving control signal SCS4 supplied from the timing controller 900. In an embodiment, for example, the fourth scan driver 500 may successively supply the fourth scan signals to the fourth scan lines SL4. The fourth scan signals may be supplied to initialize the light emitting elements included in the pixels PX and/or the characteristics of the driving transistors. The fourth scan signal may be set to a gate-on voltage (e.g., a low level). A transistor that is included in the pixel PX and configured to receive the fourth scan signal may be set to a turned-on state when the fourth scan signal is supplied thereto.

In an embodiment, the fourth scan driver 500 may supply the fourth scan signal at a constant frequency regardless of an image refresh rate frequency of the display device 1000 in response to any one scan line (e.g., SL4i) of the fourth scan lines SL4. In an embodiment, for example, the fourth scan driver 500 may perform a scanning operation (e.g., an operation of supplying at least one fourth scan signal) one time during a display scan period, and may perform a scanning operation at least one time according to an image refresh rate during a self-scan period.

In a case where the image refresh rate is reduced, the number of repetitions of the operations of supplying, by the fourth scan driver 500, fourth scan signals to the respective fourth scan lines SL4 during each frame period may be increased.

The first emission driver 600 may supply first emission control signals to the first emission control lines EL1 in response to a fifth driving control signal ECS1 supplied from the timing controller 900. In an embodiment, for example, the first emission driver 600 may successively supply first emission control signals to the first emission control lines EL1.

When the first emission control signal is supplied, the electrical connection between the driving transistor and the light emitting element that are included in each of the pixels PX may be interrupted (or electrically disconnected). Accordingly, the first emission control signal may be set to a gate-off voltage (e.g., a high level) so that the transistor included in each of the pixels PXL may be turned off. A transistor that is included in the pixel PX and configured to receive the first emission control signal may be turned off when the first emission control signal is supplied thereto, and may be turned on in the other cases. The first emission control signal may be used to control a period during which the pixels PX emit light. Hence, the first emission control signal may be set to have a width greater than that of the scan signal.

In an embodiment, the first emission driver 600 may supply the first emission control signal at a constant frequency regardless of an image refresh rate frequency, in the same manner as that of the fourth scan driver 500. Hence, in each frame period, first emission control signals to be supplied to the respective first emission control lines EL1 may be repeatedly supplied for each cycle. In a case in which the image refresh rate is reduced, the number of repetitions of the operations of supplying, by the first emission driver 600, emission control signals to the respective first emission control lines EL1 during each frame period may be increased.

The second emission driver 700 may supply second emission control signals to the second emission control lines EL2 in response to a sixth driving control signal ECS2 supplied from the timing controller 900. In an embodiment, for example, the second emission driver 700 may successively supply second emission control signals to the second emission control lines EL2.

The pixels PX may be set to a non-emission state when the second emission control signals are supplied thereto. Accordingly, the second emission control signal may be set to a gate-off voltage (e.g., a high level) so that the transistor included in each of the pixels PXL may be turned off. A transistor that is included in the pixel PX and configured to receive the second emission control signal may be turned off when the second emission control signal is supplied thereto, and may be turned on in the other cases. The second emission control signal may be used to control a period during which the pixels PX emit light. Hence, the second emission control signal may be set to have a width greater than that of the scan signal.

In an embodiment, the second emission driver 700 may supply the second emission control signal at a constant frequency regardless of an image refresh rate frequency, in the same manner as that of the fourth scan driver 500. Hence, in each frame period, second emission control signals to be supplied to the respective second emission control lines EL2 may be repeatedly supplied for each cycle.

In a case in which the image refresh rate is reduced, the number of repetitions of the operations of supplying, by the second emission driver 700, emission control signals to the respective second emission control lines EL2 during each frame period may be increased.

The data driver 800 may receive a seventh driving control signal DCS and image data RGB from the timing controller 900. The data driver 800 may supply data signals to the data lines DL in response to the seventh driving control signal DCS. In an embodiment, for example, the data driver 800 may generate analog data signals using the digital image data RGB, and supply the generated data signals to the data lines DL in synchronization with the first scan signal.

The timing controller 900 may generate the first driving control signal SCS1, the second driving control signal SCS2, the third driving control signal SCS3, the fourth driving control signal SCS4, the fifth driving control signal ECS1, the sixth driving control signal ECS2, and the seventh driving control signal DCS, in response to synchronization signals supplied from an external device. The timing controller 900 may rearrange input image data supplied from an external device to generate image data RGB and then supply the image data RGB to the data driver 800.

The first driving control signal SCS1 may include a first scan start pulse and clock signals. The first scan start pulse may control a first timing of the first scan signal outputted from the first scan driver 200. The clock signals may be used to shift the first scan start pulse.

The second driving control signal SCS2 may include a second scan start pulse and clock signals. The second scan start pulse may control a first timing of the second scan signal outputted from the second scan driver 300. The clock signals may be used to shift the second scan start pulse.

The third driving control signal SCS3 may include a third scan start pulse and clock signals. The third scan start pulse may control a first timing of the third scan signal outputted from the third scan driver 400. The clock signals may be used to shift the third scan start pulse.

The fourth driving control signal SCS4 may include a fourth scan start pulse and clock signals. The fourth scan start pulse may control a first timing of the fourth scan signal outputted from the fourth scan driver 500. The clock signals may be used to shift the fourth scan start pulse.

The fifth driving control signal ECS1 may include a first emission start pulse and clock signals. The first emission start pulse may control a first timing of the first emission control signal outputted from the first emission driver 600. The clock signals may be used to shift the first emission start pulse.

The sixth driving control signal ECS2 may include a second emission start pulse and clock signals. The second emission start pulse may control a first timing of the second emission control signal outputted from the second emission driver 700. The clock signals may be used to shift the second emission start pulse.

The seventh driving control signal DCS may include a source start pulse and clock signals. The source start pulse may control a time point at which the sampling of data starts. The clock signals may be used to control a sampling operation.

Figure 2:
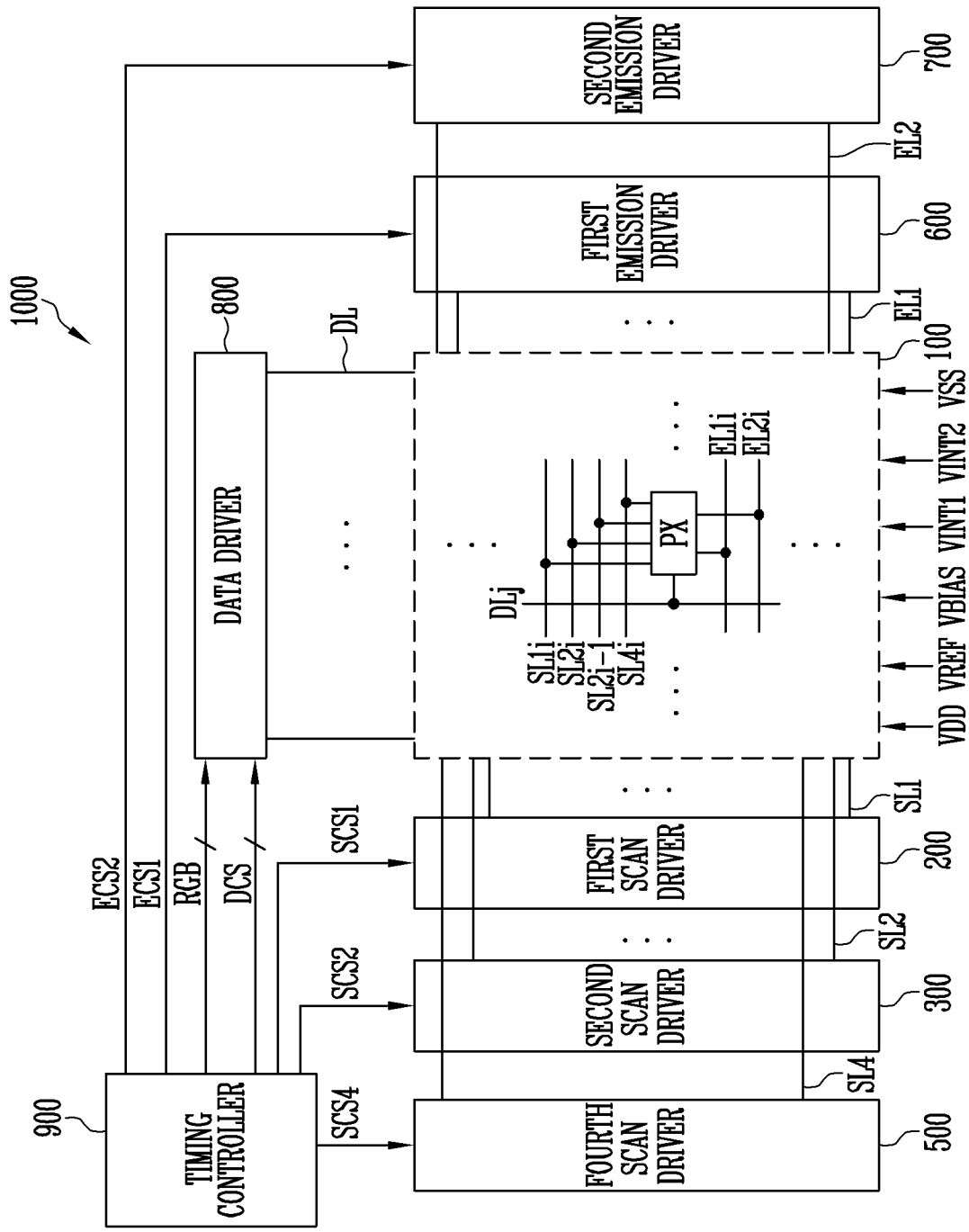
FIG. 2 is a diagram illustrating a display device in accordance with an alternative embodiment of the disclosure.

FIG. 2 is a diagram illustrating a display device 1000 in accordance with an alternative embodiment of the disclosure. In the following description of FIG. 2, the same reference numerals will be used to designate the same components as those of FIG. 1, and any repetitive detailed description thereof will be omitted.

Referring to FIG. 2, in the display device 1000 in accordance with an embodiment of the disclosure, one scan driver (e.g., the third scan driver 400) described above with reference to FIG. 1 may be omitted. In such an embodiment, the third scan lines SL3 may be omitted, and a pixel PX that is disposed on an i-th pixel row may be connected to a second scan line SL2*i*-1 corresponding to a preceding pixel row. In such an embodiment of the display device 1000, as shown in FIG. 2, one scan driver may be omitted, so that the production cost and dead space or the like may be reduced.

Figure 3:
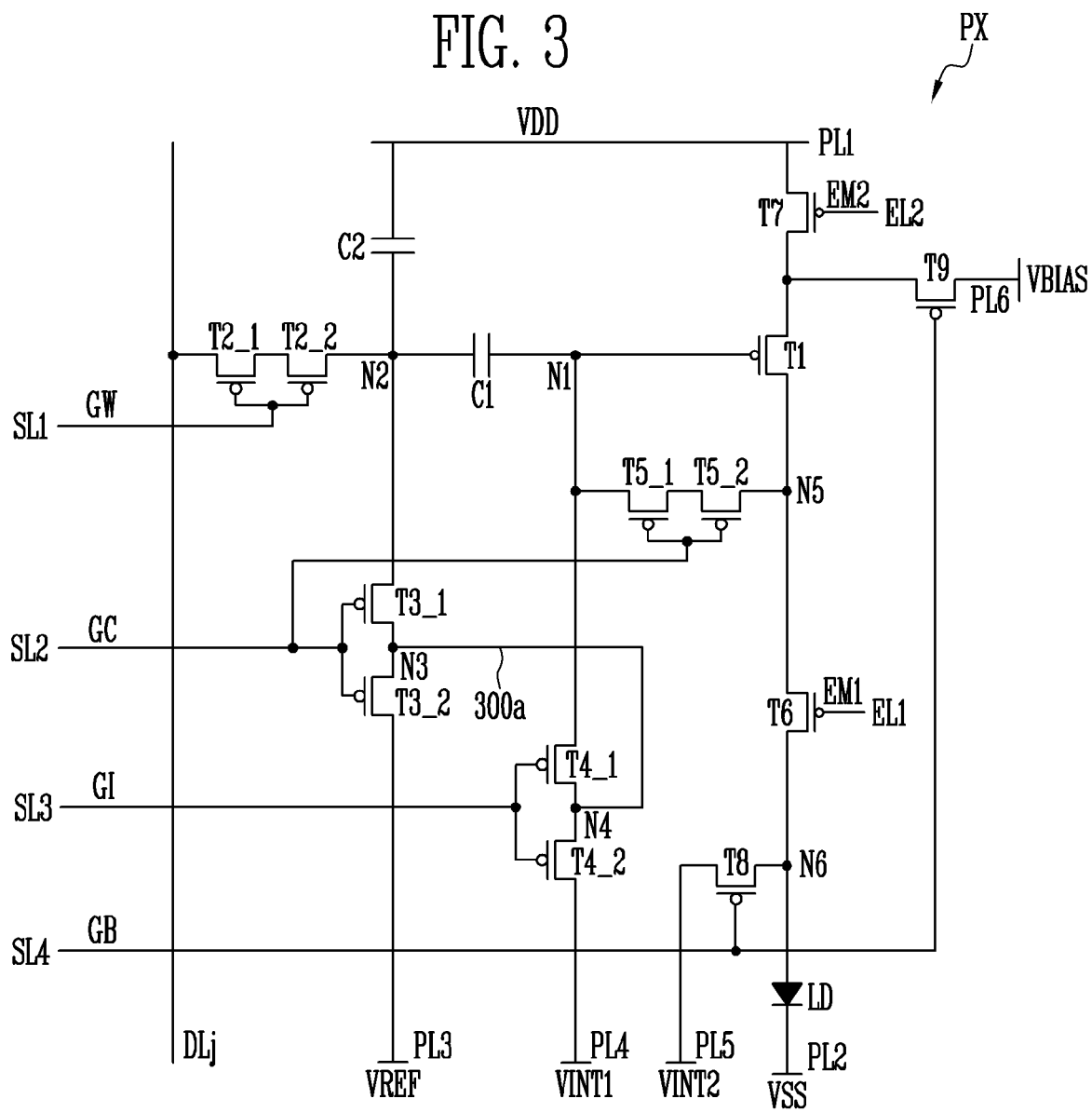
FIG. 3 is a circuit diagram illustrating an embodiment of a pixel included in the display device of FIG. 1.
Figure 4A:
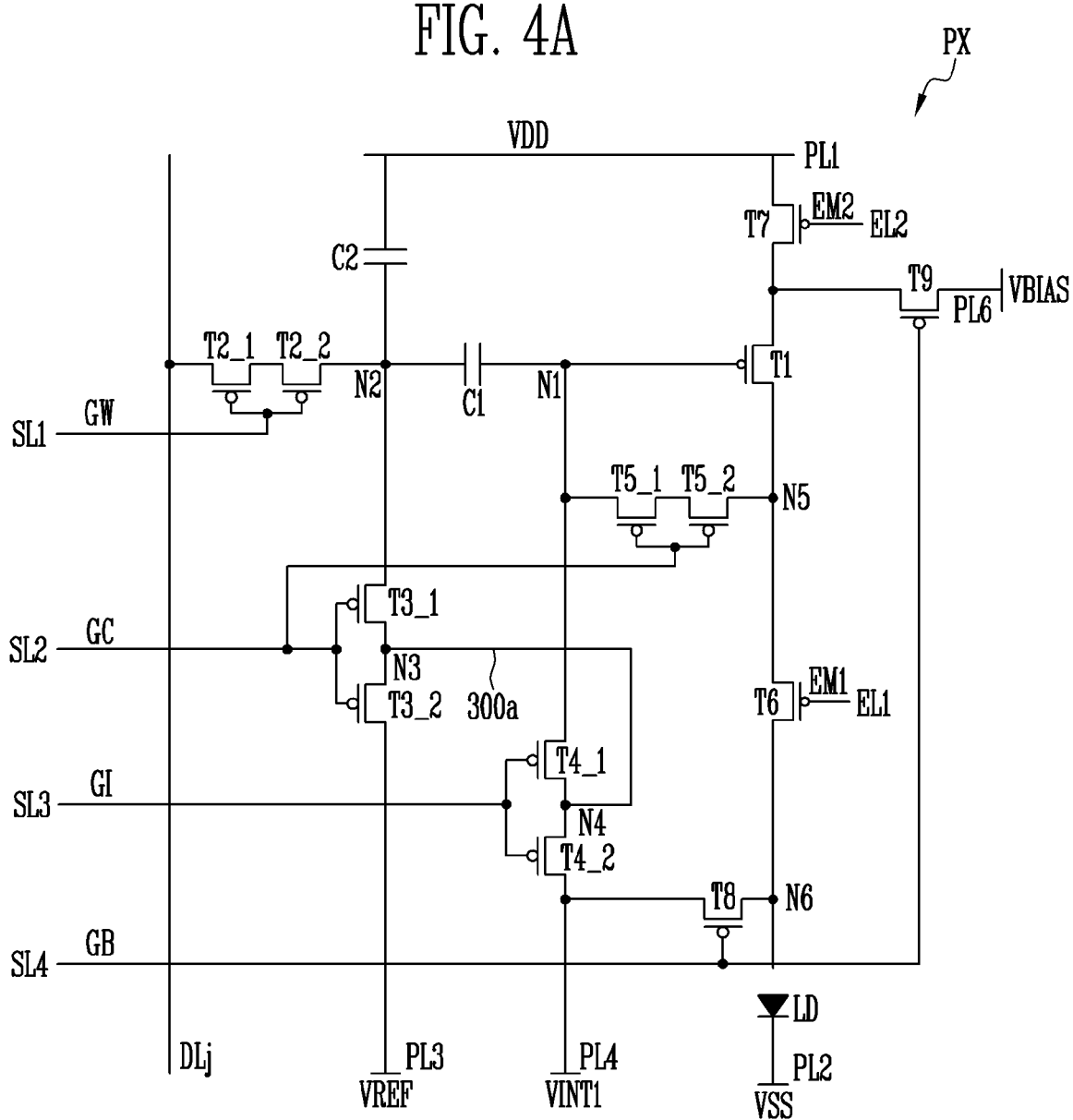
FIGS. 4A and 4B are plan views illustrating alternative embodiments of a pixel included in the display device of FIG. 1.
Figure 4B:
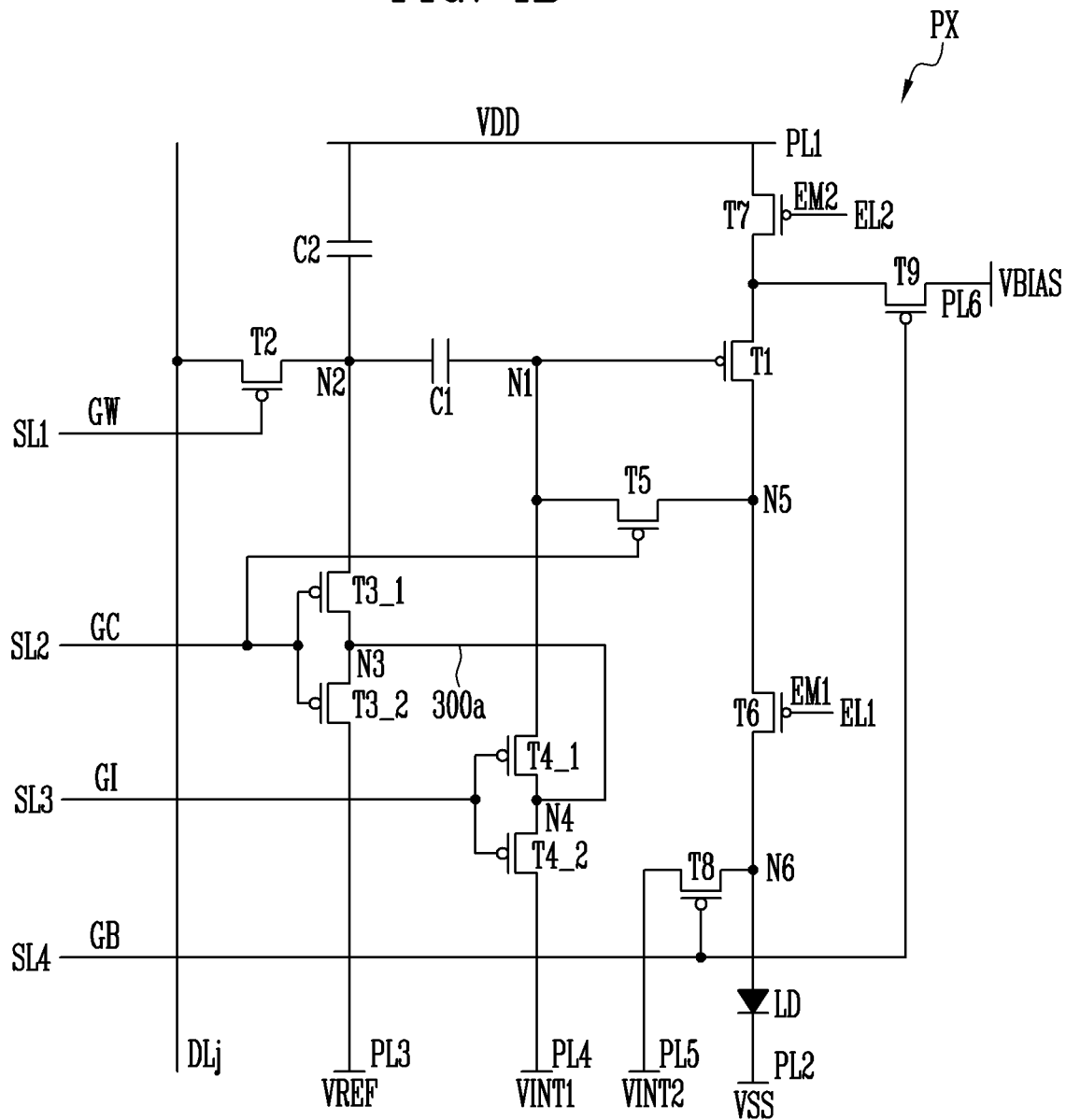

FIG. 3 is a circuit diagram illustrating an embodiment of a pixel PX included in the display device of FIG. 1. FIGS. 4A and 4B are plan views illustrating different embodiments of a pixel PX included in the display device of FIG. 1.

FIG. 3 illustrates the pixel PX disposed on an i-th pixel row and a j-th pixel column.

Referring to FIG. 3, the pixel PX in accordance with an embodiment of the disclosure may include a light emitting element LD, and a pixel circuit configured to control current flowing through the light emitting element LD.

The light emitting element LD may be connected between a first power line PL1 to which the voltage of the first power supply VDD is to be supplied, and a second power line PL2 to which the voltage of the second power supply VSS is to be supplied. In an embodiment, for example, a first electrode (e.g., an anode electrode) of the light emitting element LD may be connected to the first power line PL1 via a sixth node N6 and the pixel circuit. A second electrode (e.g., a cathode electrode) of the light emitting element LD may be connected to the second power line PL2. The light emitting element LD may emit light at a luminance corresponding to driving current supplied from the pixel circuit.

The voltage of the first power supply VDD and the voltage of the second power supply VSS may have a potential difference therebetween to allow the light emitting element LD to emit light. In an embodiment, for example, the first power supply VDD may be a high-potential power supply having a high voltage. The second power supply VSS may be a low-potential power supply having a low voltage.

In an embodiment, the light emitting element LD may be an organic light emitting diode. Alternatively, the light emitting element LD may be an inorganic light emitting diode such as a micro light emitting diode (LED) or a quantum dot light emitting diode. The light emitting element LD may be an element including or formed of a combination of organic material and inorganic material. FIG. 3 illustrates an embodiment where the pixel PX includes a single light emitting element LD, but not being limited thereto. Alternatively, the pixel PX may include a plurality of light emitting elements. In such an embodiment, the plurality of light emitting elements may be connected in series, parallel or series-parallel to each other.

The pixel circuit may include at least one transistor and at least one capacitor. In an embodiment, for example, the pixel circuit may include a first transistor T1 (or a driving transistor), a second transistor T2, a third transistor T3, a fourth transistor T4, a fifth transistor T5, a sixth transistor T6, a seventh transistor T7, an eighth transistor T8, a ninth transistor T9, a first capacitor C1, and a second capacitor C2.

In an embodiment, as shown in FIG. 3, each of the first transistor T1 (or the driving transistor), the second transistor T2, the third transistor T3, the fourth transistor T4, the fifth transistor T5, the sixth transistor T6, the seventh transistor T7, the eighth transistor T8, and the ninth transistor T9 may be a P-type transistor, but the disclosure is not limited thereto. In an alternative embodiment, for example, at least one of the first transistor T1 (or the driving transistor), the second transistor T2, the third transistor T3, the fourth transistor T4, the fifth transistor T5, the sixth transistor T6, the seventh transistor T7, the eighth transistor T8, and the ninth transistor T9 may be an N-type transistor.

A first electrode of the first transistor T1 may be connected to the first power line PL1 via the seventh transistor T7, and a second electrode thereof may be connected to a fifth node N5. A gate electrode of the first transistor T1 may be connected to a first node N1. The first transistor T1 may control, in response to the voltage of the first node N1, current flowing from the first power line PL1 (i.e., the first power supply VDD) to the second power line PL2 (i.e., the second power supply VSS) via the light emitting element LD.

A first electrode of the second transistor T2 may be connected to the data line DLj, and a second electrode thereof may be connected to a second node N2. A gate electrode of the second transistor T2 may be connected to the first scan line SL1. When a first scan signal GW is supplied to the first scan line SL1, the second transistor T2 may be turned on to electrically connect the data line DLj with the second node N2.

A first electrode of the third transistor T3 may be connected to the second node N2, and a second electrode thereof may be connected to a third power line PL3 to which the voltage of the reference power supply VREF is to be supplied. A gate electrode of the third transistor T3 may be connected to the second scan line SL2. When a second scan signal GC is supplied to the second scan line SL2, the third transistor T3 may be turned on so that the voltage of the reference power supply VREF is supplied to the second node N2. Here, the voltage of the reference power supply VREF may be set to a same voltage as that of the first power supply VDD, or may be set to a certain direct-current (DC) voltage.

A first electrode of the fourth transistor T4 may be connected to the first node N1, and a second electrode thereof may be connected to a fourth power line PL4 to which the voltage of the first initialization power supply VINT1 is to be supplied. A gate electrode of the fourth transistor T4 may be connected to the third scan line SL3. When a third scan signal GI is supplied to the third scan line SL3, the fourth transistor T4 may be turned on so that the voltage of the first initialization power supply VINT1 is supplied to the first node N1.

A first electrode of the fifth transistor T5 may be connected to a fifth node N5, and a second electrode thereof may be connected to the first node N1. A gate electrode of the fifth transistor T5 may be connected to the second scan line SL2. When a second scan signal GC is supplied to the second scan line SL2, the fifth transistor T5 may be turned on to electrically connect the first node N1 with the fifth node N5. When the fifth transistor T5 is turned on, the first transistor T1 may be connected in the form of a diode.

A first electrode of the sixth transistor T6 may be connected to a fifth node N5, and a second electrode thereof may be connected to a sixth node N6 (i.e., the anode electrode of the light emitting element LD). A gate electrode of the sixth transistor T6 may be connected to the first emission control line EL1. The sixth transistor T6 may be turned off when a first emission control signal EM1 is supplied to the first emission control line EL1, and may be turned on in other cases. When the sixth transistor T6 is turned off, the electrical connection between the first transistor T1 and the light emitting element LD may be interrupted, that is, the first transistor T1 and the light emitting element LD may be electrically disconnected from each other, so that the light emitting element LD is set to a non-emission state.

A first electrode of the seventh transistor T7 may be connected to the first power line PL1, and a second electrode thereof may be connected to the first electrode of the first transistor T1. A gate electrode of the seventh transistor T7 may be connected to the second emission control line EL2. The seventh transistor T7 may be turned off when a second emission control signal EM2 is supplied to the second emission control line EL2, and may be turned on in other cases. When the seventh transistor T7 is turned off, the electrical connection between the first power line PL1 and the first transistor T1 may be interrupted.

A first electrode of the eighth transistor T8 may be connected to the sixth node N6, and a second electrode thereof may be connected to a fifth power line PL5 to which the voltage of the second initialization power supply VINT2 is to be supplied. A gate electrode of the eighth transistor T8 may be connected to the fourth scan line SL4. When a fourth scan signal GB is supplied to the fourth scan line SL4, the eighth transistor T8 may be turned on so that the voltage of the second initialization power supply VINT2 is supplied to the anode electrode of the light emitting element LD.

When the voltage of the second initialization power supply VINT2 is supplied to the anode electrode of the light emitting element LD, a parasitic capacitor of the light emitting element LD may be discharged, so that the black expression performance may be enhanced.

The voltage of the first initialization power supply VINT1 and the voltage of the second initialization power supply VINT2 may be set to be different from each other. In such an embodiment, the voltage of the first initialization power supply VINT1 for initializing the first node N1 and the voltage of the second initialization power supply VINT2 for initializing the anode electrode of the light emitting element LD may be set to be different from each other.

If the voltage of the first initialization power supply VINT1 is excessively low in a low-frequency driving operation in which the length of each frame period is increased, a relatively high on-bias voltage may be applied to the first transistor T1, such that a flicker phenomenon may occur.

If the voltage of the second initialization power supply VINT2 for initializing the light emitting element LD is set to be higher than a certain value, the parasitic capacitor of the light emitting element LD may not be discharged but rather may be charged. Therefore, the voltage of the second initialization power supply VINT2 may be desired to be low enough to discharge the parasitic capacitor of the light emitting element LD. In an embodiment, for example, the second initialization power supply VINT2 may be set to a value lower than the sum of the threshold voltage of the light emitting element LD and the voltage of the second power supply VSS.

However, the foregoing is only for illustrative purposes, and the voltage of the first initialization power supply VINT1 and the voltage of the second initialization power supply VINT2 may be set to various values. In an alternative embodiment, for example, the first voltage of the first initialization power supply VINT1 and the voltage of the second initialization power supply VINT2 may be set to substantially the same value as each other. In such an embodiment, as illustrated in FIG. 4A, the fifth power line PL5 may be omitted, and the second electrode of the eighth transistor T8 may be connected to the fourth power line PL4.

A first electrode of the ninth transistor T9 may be connected to the sixth power line PL6 to which the voltage of the bias power supply VBIAS is supplied, and a second electrode thereof may be connected to the first electrode of the first transistor T1. A gate electrode of the ninth transistor T9 may be connected to the fourth scan line SL4. When a fourth scan signal GB is supplied to the fourth scan line SL4, the ninth transistor T9 may be turned on so that the voltage of the bias power supply VBIAS is supplied to the first electrode of the first transistor T1.

The bias power supply VBIAS may be provided to supply a bias to the first transistor T1 and be set to a certain voltage such that the first transistor T1 is set to an on-bias state. However, the disclosure is not limited thereto, and the voltage of the bias power supply VBIAS may be set to various values.

In an embodiment, as illustrated in FIG. 3, to minimize leakage current from the first node N1 and the second node N2, the second transistor T2, the third transistor T3, the fourth transistor T4, and the fifth transistor T5 each may be implemented as a dual-gate transistor (or a transistor including a plurality of sub-transistors connected in series to each other).

In an embodiment, for example, the second transistor T2 may include a plurality of sub-transistors T2_1 and T2_2 connected in series between the data line DLj and the second node N2. The fifth transistor T5 may include a plurality of sub-transistors T5_1 and T5_2 connected in series between the first node N1 and the fifth node N5.

In such an embodiment, the third transistor T3 may include a plurality of sub-transistors T3_1 and T3_2 connected in series between the second node N2 and the third power line PL3. The fourth transistor T4 may include a plurality of sub-transistors T4_1 and T4_2 connected in series between the first node N1 and the fourth power line PL4.

In an embodiment, the first node N1 and the second node N2 are desired to be electrically connected to each other during a test process to easily detect a defect of the pixel PX. In an embodiment of the disclosure, a connector (or a connection unit) may be provided to electrically connect the first node N1 and the second node N2 to each other during the test process. In an embodiment, for example, the connector may include a connection line 300a provided to electrically connect the third node N3 between the first sub-transistors T3_1 and T3_2 to the fourth node N4 between the second sub-transistors T4_1 and T4_2. When the third transistor T3 and the fourth transistor T4 are simultaneously turned on, the second node N2 may be electrically connected to the first node N1 via the third node N3 and the fourth node N4, so that a defective pixel may be easily determined during a production process.

In a case where the connection line 300a is not provided, the first node N1 and the second node N2 are separated from each other by the first capacitor C1. Hence, a current path is not formed between the first node N1 and the second node N2. In this case, even when a certain voltage is supplied to the data line DLj during the test process, the voltage of the sixth node N6 is not changed, so that it is difficult to determine a defective pixel.

In an embodiment of the disclosure, in a case where the third node N3 and the fourth node N4 are connected to each other by the connection line 300a, the first node N1 and the second node N2 may be electrically connected to each other when the third transistor T3 and the fourth transistor T4 are turned on. In this case, during the test process, the voltage of the sixth node N6 may be changed by a certain voltage supplied to the data line DLj, so that a defective pixel may be easily determined.

In an alternative embodiment, as illustrated in FIG. 4B, the second transistor T2 and the fifth transistor T5 each may be formed of or defined by a single transistor.

The second capacitor C2 may be connected between the first power line PL1 and the second node N2. The second capacitor C2 may store the voltage of the second node N2, and stabilize the voltage of the second node N2.

The first capacitor C1 may be connected between the second node N2 and the first node N1. The first capacitor C1 may store a voltage between the first node N1 and the second node N2.

FIG. 5 is a waveform diagram for describing an embodiment of the operation of the pixel PX during a display scan period DSP of one frame.

Referring to FIG. 5, the pixel PX may be supplied with signals for image display during the display scan period DSP. Accordingly, the display scan period DSP may include a period during which a data signal is written.

The display scan period DSP may include a first period P1 during which the threshold voltage of the first transistor T1 is compensated for, a second period P2 during which a data signal is supplied, a third period P3 during which the voltage of the bias power supply VBIAS and the voltage of the second initialization power supply VINT2 are applied, and a fourth period P4 during which the pixel PX emits light in response to the data signal.

The first period P1 to the third period P3 may be set to a non-emission period of the pixel PX. enduring the non-emission period, a first emission control signal EM1 may be supplied to the first emission control line EL1 during a period ranging from the first period P1 to the third period P3. The sixth transistor T6 may be set to a turned-off state when the first emission control signal EM1 is supplied to the first emission control line EL1. The second emission control signal EM2 may be supplied to the second emission control line EL2 during the second period P2 and the third period P3. The seventh transistor T7 may be set to a turned-off state when the second emission control signal EM2 is supplied to the second emission control line EL2. As such, in a case where the sixth transistor T6 and/or the seventh transistor T7 is turned off, the current path from the first power line PL1 to the light emitting element LD may be interrupted, so that the pixel PX may be set to a non-emission state.

The fourth period P4 may be set to an emission period during which the pixel PX emits light in response to a data signal. Here, in a case where the data signal corresponds to a black grayscale, the pixel PX may be set to a non-emission state during the fourth period P4.

The first period P1 may include a plurality of sub-period P1a, P1b, and P1c. Although FIG. 5 illustrates an embodiment where the first period P1 includes three sub-periods P1a, P1b, and P1c, the disclosure is not limited thereto. In an alternative embodiment, for example, the first period P1 may include two sub-periods or four or more sub-periods.

During the first sub-period P1a, the third scan signal GI and the second scan signal GC may be respectively successively supplied to the third scan line SL3 and the second scan line SL2. When the third scan signal GI is supplied to the third scan line SL3, the fourth transistor T4 may be turned on. When the fourth transistor T4 is turned on, the voltage of the first initialization power supply VINT1 may be supplied to the first node N1, and the first node N1 may be initialized to the voltage of the first initialization power supply VINT1.

When the second scan signal GC is supplied to the second scan line SL2, the third transistor T3 and the fifth transistor T5 may be turned on. When the third transistor T3 is turned on, the voltage of the reference power supply VREF may be supplied to the second node N2, and the second node N2 may be initialized to the voltage of the reference power supply VREF.

When the fifth transistor T5 is turned on, the first node N1 and the fifth node N5 may be electrically connected to each other. In this case, the first transistor T1 may be connected in the form of a diode. When the first transistor T1 is connected in the form of a diode, the voltage of the first power supply VDD may be supplied from the first power line PL1 to the first node N1 via the first transistor T1 having the form of a diode. In this case, a voltage obtained by subtracting the absolute value threshold voltage of the first transistor T1 from the voltage of the first power supply VDD may be applied to the first node N1. Hence, a voltage corresponding to the threshold voltage of the first transistor T1 may be stored in the first capacitor C1. In an embodiment where the voltage of the reference power supply VREF is the same as the voltage of the first power supply VDD, the threshold voltage of the first transistor T1 may be stored in the first capacitor C1.

During the first sub-period P1a, the voltage of the second node N2 may be changed from the voltage of a preceding data signal to the voltage of the reference power supply VREF, and a change in voltage of the second node N2 may be transmitted to the first node N1 by coupling of the first capacitor C1. In this case, during the first sub-period P1a, a portion of the voltage corresponding to the preceding data signal may be included in the voltage stored in the first capacitor C1.

Here, in the case where during the first sub-period P1a, the time for which the second scan signal GC is applied to the second scan line SL2 is sufficiently long (e.g., three horizontal periods or more), a voltage corresponding to the threshold voltage of the first transistor T1 may be stored in the first capacitor C1 regardless of the preceding data signal. In an embodiment of the disclosure, the first period P1 may further include a second sub-period P1b and a third sub-period P1c.

During the second sub-period P1b and the third sub-period P1c, the third scan signal GI and the second scan signal GC may be respectively successively supplied to the third scan line SL3 and the second scan line SL2. Hence, as described above with reference to the first sub-period P1a, a voltage corresponding to the threshold voltage of the first transistor T1 may be stored in the first capacitor C1. As such, in the case where the first period P1 includes a plurality of sub-periods P1a, P1b, and P1c, a desired voltage may be stably stored in the first capacitor C1.

During the second period P2, the first scan signal GW may be supplied to the first scan line SL1. When the first scan signal GW is supplied to the first scan line SL1, the second transistor T2 may be turned on. Here, the first scan signal GW may be supplied during one horizontal period.

When the second transistor T2 is turned on, the data line DLj and the second node N2 may be electrically connected to each other, so that the voltage of the data signal may be supplied to the second node N2. The voltage of the second node N2 may be changed from the voltage of the reference power supply VREF to the voltage of the data signal. Because the first node N1 is connected to the second node N2 by the first capacitor C1, a difference (i.e., Vdata-VREF) in voltage of the second node N2 may be reflected in the first node N1 (here, Vdata refers to the voltage of the data signal). Therefore, the voltage of the first node N1 may be changed to a voltage of "VDD−Vth+(Vdata−VREF)".

In an embodiment of the disclosure, the threshold voltage of the first transistor T1 may be compensated for during the first period P1, and the voltage of the data signal may be supplied to the pixel PX during the second period P2. In such an embodiment of the disclosure, the threshold voltage of the first transistor T1 may be compensated for using a separate period (i.e., the first period P1) regardless of whether the data signal is supplied thereto. Hence, even in a low-frequency driving operation, time for compensate for the threshold voltage of the first transistor T1 may be sufficiently secured.

During the third period P3, at least one fourth scan signal GB may be supplied to the fourth scan line SL4. In an embodiment, for example, during the third period P3, three fourth scan signals GB may be successively supplied to the fourth scan line SL4, but the disclosure is not limited thereto.

When the fourth scan signal GB is supplied to the fourth scan line SL4, the eighth transistor T8 and the ninth transistor T9 may be turned on. When the eighth transistor T8 is turned on, the voltage of the second initialization power supply VINT2 is supplied from the fifth power line PL5 to the sixth node N6. Hence, the charge that is charged to the parasitic capacitor formed in the light emitting element LD may be initialized.

When the ninth transistor T9 is turned on, the voltage of the bias power supply VBIAS may be supplied to the first electrode of the first transistor T1. Hence, the characteristics of the first transistor T1 may be initialized to a specific state (e.g., an on-bias state), whereby an image having a uniform luminance can be displayed.

Because a plurality of fourth scan signals GB are successively supplied to the fourth scan line SL4, the voltage of the second initialization power supply VINT2 may be supplied to the sixth node N6 several times, such that the parasitic capacitor of the light emitting element LD may be stably initialized. Because a plurality of fourth scan signal GB are successively supplied to the fourth scan line SL4, the first transistor T1 may be set to a bias state several times, such that the characteristics of the first transistor T1 may be set to a desired state.

During the fourth period P4, the supply of the first emission control signal EM1 to the first emission control line EL1 may be interrupted, and the supply of the second emission control signal EM2 to the second emission control line EL2 may be interrupted. When the supply of the first emission control signal EM1 is interrupted, the sixth transistor T6 may be turned on, so that the first transistor T1 and the light emitting element LD is electrically connected to each other. When the supply of the second emission control signal EM2 is interrupted, the seventh transistor T7 may be turned on, so that the first power line PL1 and the first transistor T1 is electrically connected to each other.

Therefore, during the fourth period P4, a current path from the first power line PL1 to the second power line PL2 via the first transistor T1 and the light emitting element LD may be formed. The first transistor T1 may supply certain current to the light emitting element LD in response to the voltage applied to the first node N1, so that during the fourth period P4 the light emitting element LD may generate light having a certain luminance.

Figure 6:
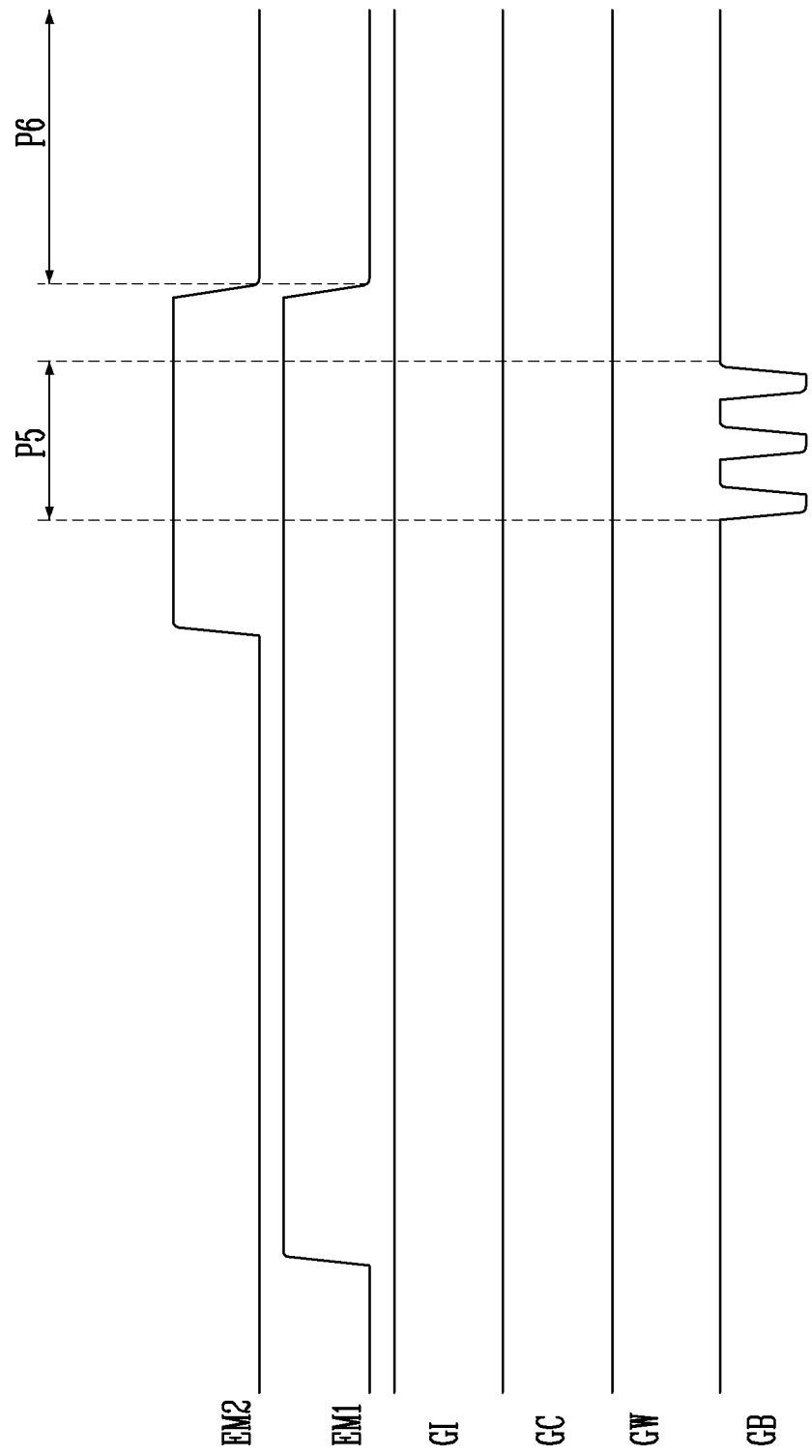
FIG. 6 is a waveform diagram for describing an embodiment of the operation of the pixel during a self-scan period of one frame.

FIG. 6 is a waveform diagram for describing an embodiment of the operation of the pixel during a self-scan period SSP of one frame.

Referring to FIG. 6, during the self-scan period SSP, an operation of initializing the light emitting element LD and initializing the characteristics of the first transistor T1 may be performed.

Each frame may include at least one self-scan period SSP in response to an image refresh rate. The self-scan period SSP may include a fifth period P5 and a sixth period P6.

In an embodiment, the first emission control signal EM1 may be supplied to the first emission control line EL1 before the fifth period P5 and during the fifth period P5. The sixth transistor T6 may be set to a turned-off state when the first emission control signal EM1 is supplied to the first emission control line EL1. In such an embodiment, the second emission control signal EM2 may be supplied to the second emission control line EL2 after the first emission control signal EM1 has been supplied and during the fifth period P5. The seventh transistor T7 may be set to a turned-off state if the second emission control signal EM2 is supplied to the second emission control line EL2. As such, in the case where the sixth transistor T6 and/or the seventh transistor T7 is turned off, the current path from the first power line PL1 to the light emitting element LD may be interrupted, so that the pixel PX may be set to a non-emission state.

The first emission control signal EM1 supplied to the first emission control line EL1 and the second emission control signal EM2 supplied to the second emission control line EL2 may be supplied to have the same width (or length, time) as the display scan period DSP.

During the fifth period P5, at least one fourth scan signal GB may be supplied to the fourth scan line SL4. In an embodiment, for example, the number of fourth scan signals GB supplied during the fifth period P5 may be the same as that of the third period P3.

When the fourth scan signal GB is supplied to the fourth scan line SL4, the eighth transistor T8 and the ninth transistor T9 may be turned on. When the eighth transistor T8 is turned on, the voltage of the second initialization power supply VINT2 is supplied from the fifth power line PL5 to the sixth node N6. Hence, the charge that is charged to the parasitic capacitor formed in the light emitting element LD may be initialized.

When the ninth transistor T9 is turned on, the voltage of the bias power supply VBIAS may be supplied to the first electrode of the first transistor T1. Hence, the characteristics of the first transistor T1 may be initialized to a specific state (e.g., an on-bias state), whereby an image having a uniform luminance can be displayed.

The fourth scan signal GB and the emission control signals EM1 and EM2 each may be supplied at a uniform frequency regardless of the image refresh rate. Therefore, even if the image refresh rate varies, the light emitting element LD and the characteristics of the first transistor T1 may be periodically initialized. Accordingly, the pixel PX may represent uniform luminance characteristics in response to the image refresh rate (particularly, the low-frequency driving operation).

During the sixth period P6, the supply of the first emission control signal EM1 to the first emission control line EL1 may be interrupted, and the supply of the second emission control signal EM2 to the second emission control line EL2 may be interrupted. When the supply of the first emission control signal EM1 is interrupted, the sixth transistor T6 may be turned on, so that the first transistor T1 and the light emitting element LD is electrically connected to each other. When the supply of the second emission control signal EM2 is interrupted, the seventh transistor T7 may be turned on, so that the first power line PL1 and the first transistor T1 is electrically connected to each other.

Therefore, during the sixth period P6, a current path extending from the first power line PL1 to the second power line PL2 via the first transistor T1 and the light emitting element LD may be formed. The first transistor T1 may supply certain current to the light emitting element LD in response to the voltage applied to the first node N1, so that during the sixth period P6 the light emitting element LD may generate light having a certain luminance.

Figure 7:
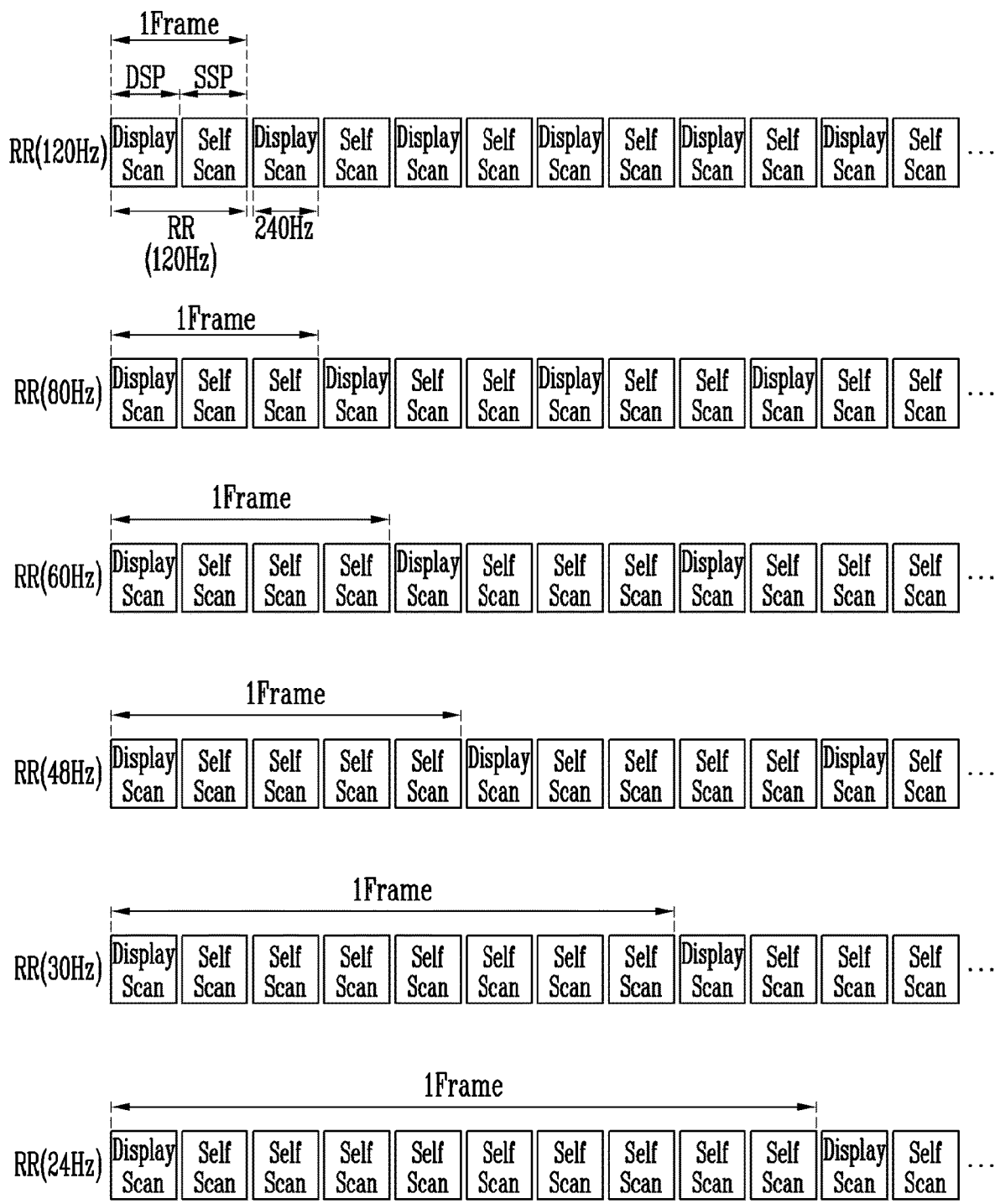
FIG. 7 is a conceptual view for describing a display method of a display device according to an image refresh rate.

FIG. 7 is a conceptual view for describing a display method of the display device according to an image refresh rate.

Referring to FIG. 7, depending on the image refresh rate RR, the first scan signal GW, the second scan signal GC, and the third scan signal GI may be changed in output frequency. In an embodiment, for example, the first scan signal GW, the second scan signal GC, and the third scan signal GI may be increased in frequency in proportion to the image refresh rate RR.

In an embodiment, the fourth scan signal GB and the emission control signals EM1 and EM2 each may be supplied at a constant frequency regardless of the image refresh rate. In an embodiment, for example, the fourth scan signal GB and the emission control signals EM1 and EM2 each may be set to a frequency two times the maximum refresh rate that can be embodied in the display device 1000.

In an embodiment, the length of the display scan period DSP and the length of the self-scan period SSP may be substantially the same as each other. The number of self-scan periods SSP included in each frame period may be determined depending on the image refresh rate RR.

As illustrated in FIG. 7, in a case where the display device 1000 is driven at an image refresh rate RR of 120 Hz, each frame period may include one display scan period DSP and one self-scan period SSP. Hence, in the case where the display device 1000 is driven at an image refresh rate RR of 120 Hz, the pixels PX each may alternately repeat an emission operation and a non-emission operation two times during each frame period.

In the case where the display device 1000 is driven at an image refresh rate RR of 80 Hz, each frame period may include one display scan period DSP and two self-scan periods SSP. Hence, in the case where the display device 1000 is driven at an image refresh rate RR of 80 Hz, the pixels PX each may alternately repeat an emission operation and a non-emission operation three times during each frame period.

In a manner similar to the foregoing, the display device 1000 may be driven at a driving frequency of 60 Hz, 48 Hz, 30 Hz, 24 Hz, 1 Hz, or the like by adjusting the number of self-scan periods SSP included in each frame.

In embodiments of the disclosure, as the driving frequency is reduced, the number of self-scan periods SSP included in each frame is increased, so that the light emitting element LD and first transistor T1 that are included in each pixel PX may be initialized at a constant cycle, such that the pixel PX may represent uniform luminance characteristics.

Figure 8:
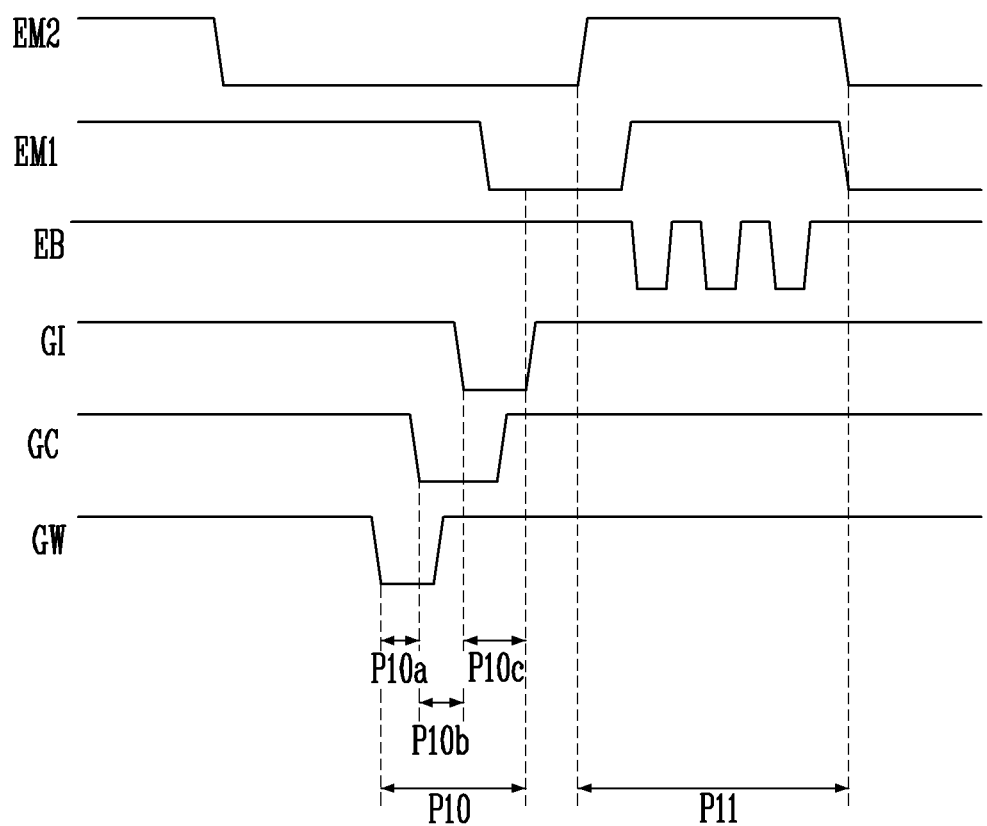
FIG. 8 is a diagram illustrating an embodiment of driving signals supplied during a pixel test process of a production process in accordance with an embodiment.
Figure 9:
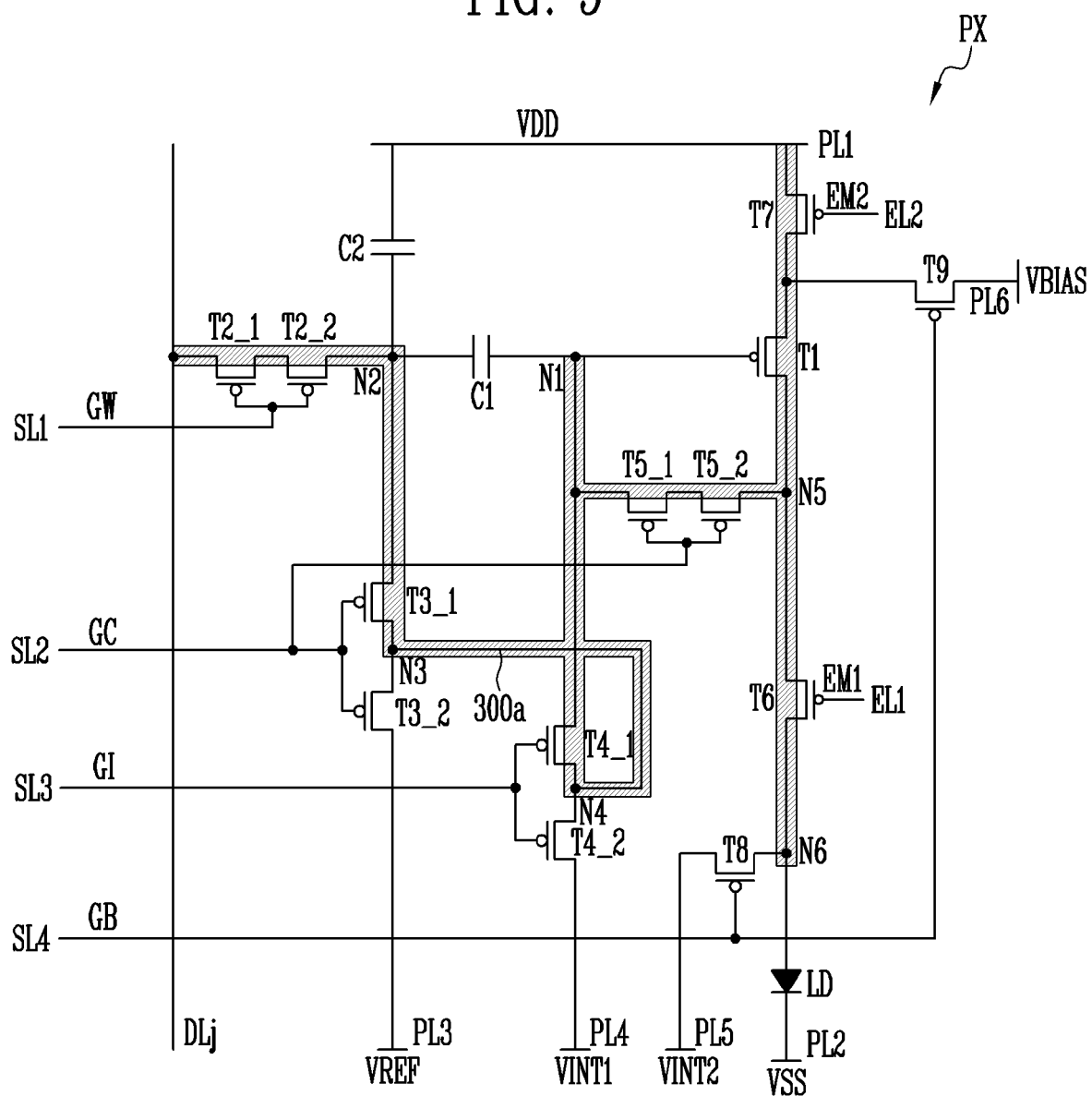
FIG. 9 is a circuit diagram illustrating a path of current during the test process.

FIG. 8 is a diagram illustrating an embodiment of driving signals supplied during a pixel test process of a production process in accordance with an embodiment. FIG. 9 is a diagram illustrating a path of current during the test process.

In the pixel PX in accordance with an embodiment, the third node N3 and the fourth node N4 may be electrically connected to each other by the connection line 300a, as described above. In such an embodiment, a current path may be formed between the third node N3 and the fourth node N4. Hence, during the test process, it may be easy to determine whether the transistors are defective. The driving signals supplied during the test process may be changed in various shapes such that current can flow between the third node N3 and the fourth node N4.

The test process of the pixel PX may refer to a process of determining whether there is a defect using the voltage of the sixth node N6 before the anode electrode of the light emitting element LD is deposited (here, the same test process may be performed even after the anode electrode has been deposited).

Referring to FIG. 8, during a tenth period P10, the second emission control signal EM2 may not be supplied to the second emission control line EL2, so that the seventh transistor T7 is set to a turned-on state. Accordingly, during the test process, the first power line PL1 may be electrically connected to the first transistor T1.

During the tenth period P10, the first scan signal GW, the second scan signal GC, the third scan signal GI may be respectively successively supplied to the first scan line SL1, the second scan line SL2, and the third scan line SL3. In such an embodiment, in the tenth period P10, the first scan signal GW may be supplied during a first sub-period P10a, the second scan signal GC may be supplied during the second sub-period P10b, and the third scan signal GI may be supplied during the third sub-period P10c.

Here, the first scan signal GW and the second scan signal GC overlap each other during a partial period of the second sub-period P10b. The second scan signal GC and the third scan signal GI may overlap each other during a partial period of the third sub-period P10c. The supply of the first emission control signal EM1 to the first emission control line EL1 may be interrupted during a partial period of the third sub-period P10c.

When the first scan signal GW is supplied to the first scan line SL1, the second transistor T2 may be turned on, so that a certain voltage (hereinafter, referred to as "test voltage") may be supplied from the data line to the second node N2. The test voltage may be a voltage for testing the pixel PX, and may be set to various voltages. In an embodiment, for example, the test voltage may be set to a positive voltage (e.g., a voltage of 5 volts (V) or more) so that a certain voltage is applied to the sixth node N6. The test voltage supplied to the second node N2 may be stored in the second capacitor C2.

When the second scan signal GC is supplied to the second scan line SL2, the third transistor T3 and the fifth transistor T5 may be turned on. When the third transistor T3 is turned on, the second node N2 may be electrically connected to the fourth node N4 via the third node N3. Hence, a certain voltage may be applied to the fourth node N4 in response to the test voltage stored in the second capacitor C2. When the fifth transistor T5 is turned on, the first node N1 and the fifth node N5 may be electrically connected to each other.

Thereafter, the supply of the first scan signal GW to the first scan line SL1 is interrupted, so that the second transistor T2 may be turned off. Furthermore, the third scan signal GI is supplied to the third scan line SL3, so that the fourth transistor T4 may be turned on. When the seventh transistor T4 is turned on, the first node N1 and the fifth node N4 may be electrically connected to each other. Here, because the third transistor T3 remains turned on, the second node N2 and the fifth node N5 may be electrically connected to each other. Hence, a voltage corresponding to certain current supplied from the first power line PL1 thereto via the first transistor T1 and a voltage corresponding to a test voltage supplied from the second capacitor C2 may be applied to the fifth node N5. Hereinafter, the voltage applied to the fifth node N5 will be referred to as a measurement voltage.

After the measurement voltage is applied to the fifth node N5, the supply of the first emission control signal EM1 to the first emission control line EL1 may be interrupted, so that the sixth transistor T6 may be turned on. When the sixth transistor T6 is turned on, the measurement voltage of the fifth node N5 may be applied to the sixth node N6. Whether the pixel PX is defective may be determined by measuring the voltage of the sixth node N6 using an external test device. In an embodiment, for example, the voltage of the fifth node N5 may be stored in the parasitic capacitor of the first transistor T1 or the like and then supplied to the sixth node N6 (in addition, a turn-on period of the sixth transistor T6 may overlap a turn-on period of each of the sixth transistor T3, the fourth transistor T4, and the fifth transistor T5).

In such an embodiment, as illustrated in FIG. 9, the measurement voltage to be supplied to the sixth node N6 may correspond both to a current path from the data line DLj to the sixth node N6 and to a current path from the first power line PL1 to the sixth node N6. Hence, whether the pixel PX is defective may be determined by measuring the voltage of the sixth node N6.

For example, in a case where the second transistor T2 is defective, the test voltage is not allowed to be supplied to the second node N2, so that the voltage measured on the sixth node N6 does not reach a desired voltage. Likewise, in a case where the seventh transistor T7 is defective, current corresponding to the first power supply VDD is not allowed to be supplied to the sixth node N6, so that the voltage measured on the sixth node N6 does not reach the desired voltage. In an embodiment of the disclosure, the third node N3 and the fourth node N4 may be connected to each other by the connection line 300a, so that a defect of the pixel PX may be reliably detected.

Experimentally, after the first scan signal GW, the second scan signal GC, and the third scan signal GI are successively supplied, the measurement voltage to be applied to the sixth node N6 may be set to be different between the case where the test voltage to the data line Dj and the other case. Hence, whether the pixel PX is defective may be determined.

During the tenth period P10, the voltage of the reference power supply VREF and the voltage of the first initialization power supply VINT1 may be set to various values. In an embodiment, for example, during the tenth period P10, the third power line PL3 and the fourth power line PL4 may be set to a floating state. In an embodiment, during the tenth period P10, the reference power supply VREF may be set to a certain negative voltage, and the first initialization power supply VINT1 may be set to a positive voltage.

During an eleventh period P11, the first emission control signal EM1 may be supplied to the first emission control line EL1, so that the sixth transistor T6 may be turned off. Furthermore, during the eleventh period P11, the second emission control signal EM2 may be supplied to the second emission control line EL2, so that the seventh transistor T7 may be turned off.

During the eleventh period P11, the fourth scan signal GB may be supplied to the fourth scan line SL4. When the fourth scan signal GB is supplied to the fourth scan line SL4, the eighth transistor T8 and the ninth transistor T9 may be turned on. When the eighth transistor T8 is turned on, the sixth node N6 may be initialized to the voltage of the second initialization power supply VINT2. When the ninth transistor T9 is turned on, the first electrode of the first transistor T1 may be initialized to the voltage of the bias power supply VBIAS. In addition, during the eleventh period P11, whether the eighth transistor T8 is defective may be determined by measuring the voltage of the sixth node N6.

As described above, in an embodiment of the disclosure, during the test process, a current path extending from the data line DLj to the sixth node N6 may be formed by the connection line 300a that electrically connects the third node N3 and the fourth node N4 to each other, so that whether the pixel PX is defective may be determined. In an embodiment of the disclosure, driving signals supplied during the test process may be set in various ways such that the current path from the data line DLj to the sixth node N6 is formed.

Figure 10:
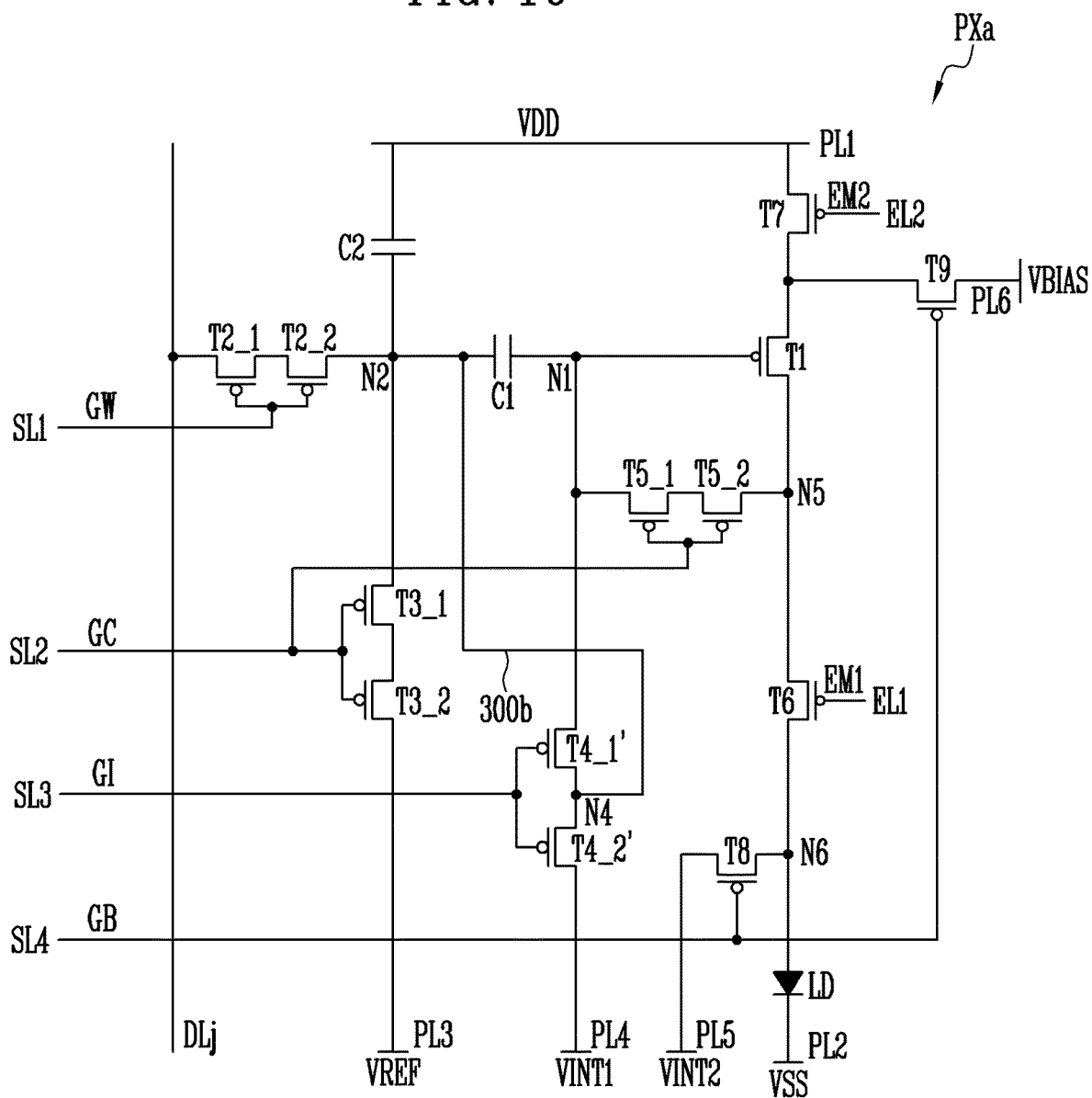
FIGS. 10 to 12 are circuit diagrams each illustrating a pixel in accordance with an alternative embodiment of the disclosure.

FIG. 10 is a circuit diagram illustrating a pixel PXa in accordance with an alternative embodiment of the disclosure. In the following description of FIG. 10, the same reference numerals will be used to designate the same components as those of FIG. 3, and any repetitive detailed description thereof will be omitted.

Referring to FIG. 10, the pixel PXa in accordance with an embodiment of the disclosure may include a connection line 300b connected between the second node N2 and the fourth node N4 as a connector. The connection line 300b may electrically connect the second node N2 and the fourth node N4 to each other. In an embodiment of the pixel PXa illustrated in FIG. 10, a current path extending from the data line DLj to the sixth node N6 may be formed using the connection line 300b, so that whether the pixel PXa is defective may be determined during a test process.

Figure 11:
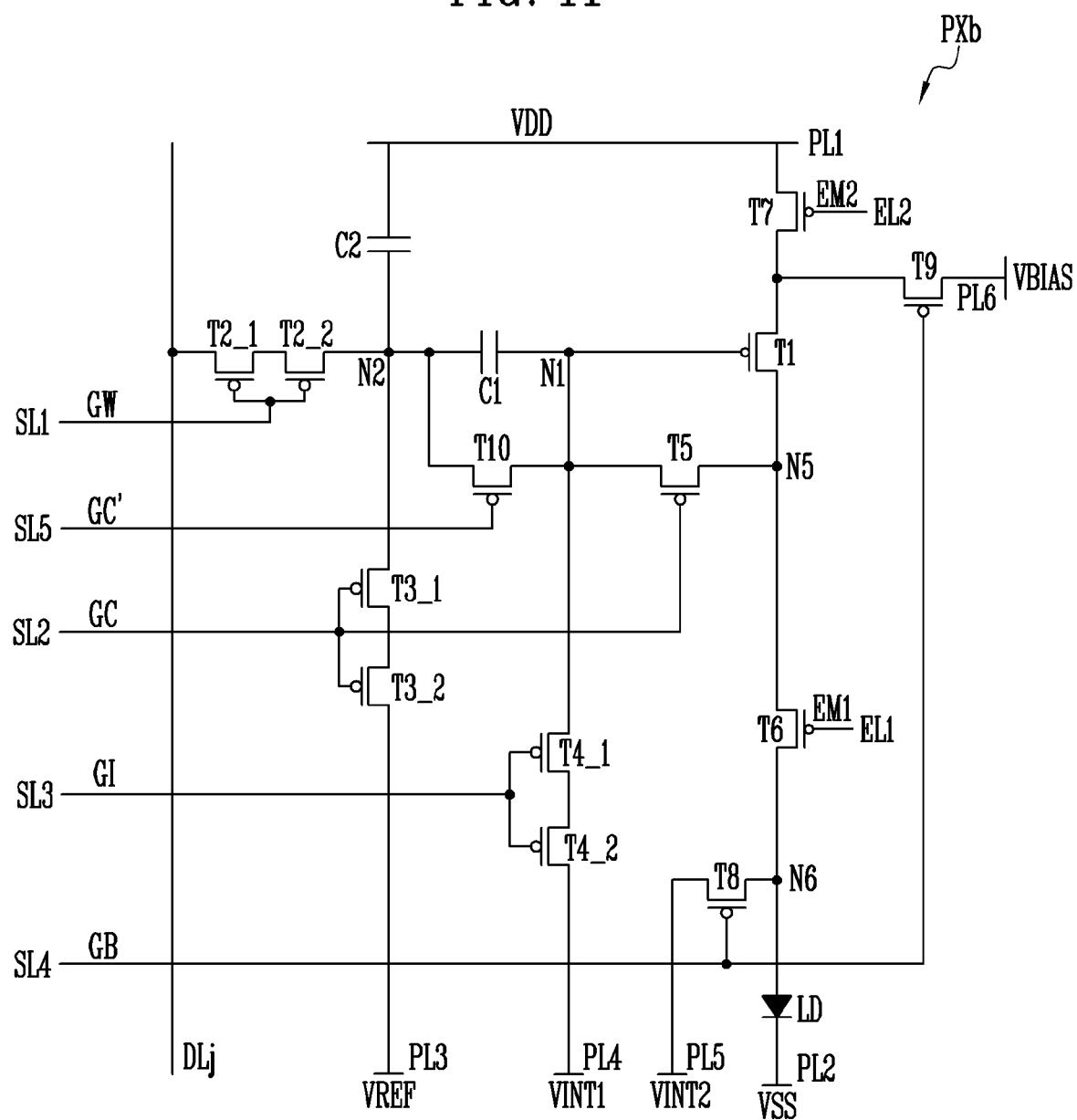

FIG. 11 is a circuit diagram illustrating a pixel PXb in accordance with another alternative embodiment of the disclosure. In the following description of FIG. 11, the same reference numerals will be used to designate the same components as those of FIG. 3, and any repetitive detailed description thereof will be omitted.

Referring to FIG. 11, the pixel PXb in accordance with an embodiment of the disclosure may include, as a connector, a tenth transistor T10 (or a connection transistor) which is connected between the first node N1 and the second node N2 and includes a gate electrode connected to a fifth scan line SL5.

When a fifth scan signal GC' is supplied to the fifth scan line SL5, the tenth transistor T10 may be turned on to electrically connect the first node N1 with the second node N2. When the first node N1 and the second node N2 are electrically connected to each other, a current path extending from the data line DLj to the sixth node N6 may be formed, so that whether the pixel PXb is defective may be determined during a test process.

In such an embodiment, during the test process, the fifth scan signal GC' may be supplied at a same timing as that of the second scan signal GC supplied to the second scan line SL2. In an embodiment, for example, during the test process, the fifth scan signal GC' may be supplied in a period overlapping a period during which the first scan signal GW and the second scan signal GC are supplied, so that a current path extending from the data line DLj to the sixth node N6 may be formed. In such an embodiment of the disclosure, the supply timings of the scan signals GW, GC, GC', and Gi and the emission control signals EM1 and EM2 may be controlled in various forms so that the current path extending from the data line DLj to the sixth node N6 may be formed.

During the display scan period DSP and the self-scan period SSP, the fifth scan signal GC' may not be supplied to the fifth scan line SL5. Accordingly, the tenth transistor T10 may remain turned off during a period other than the test process.

Figure 12:
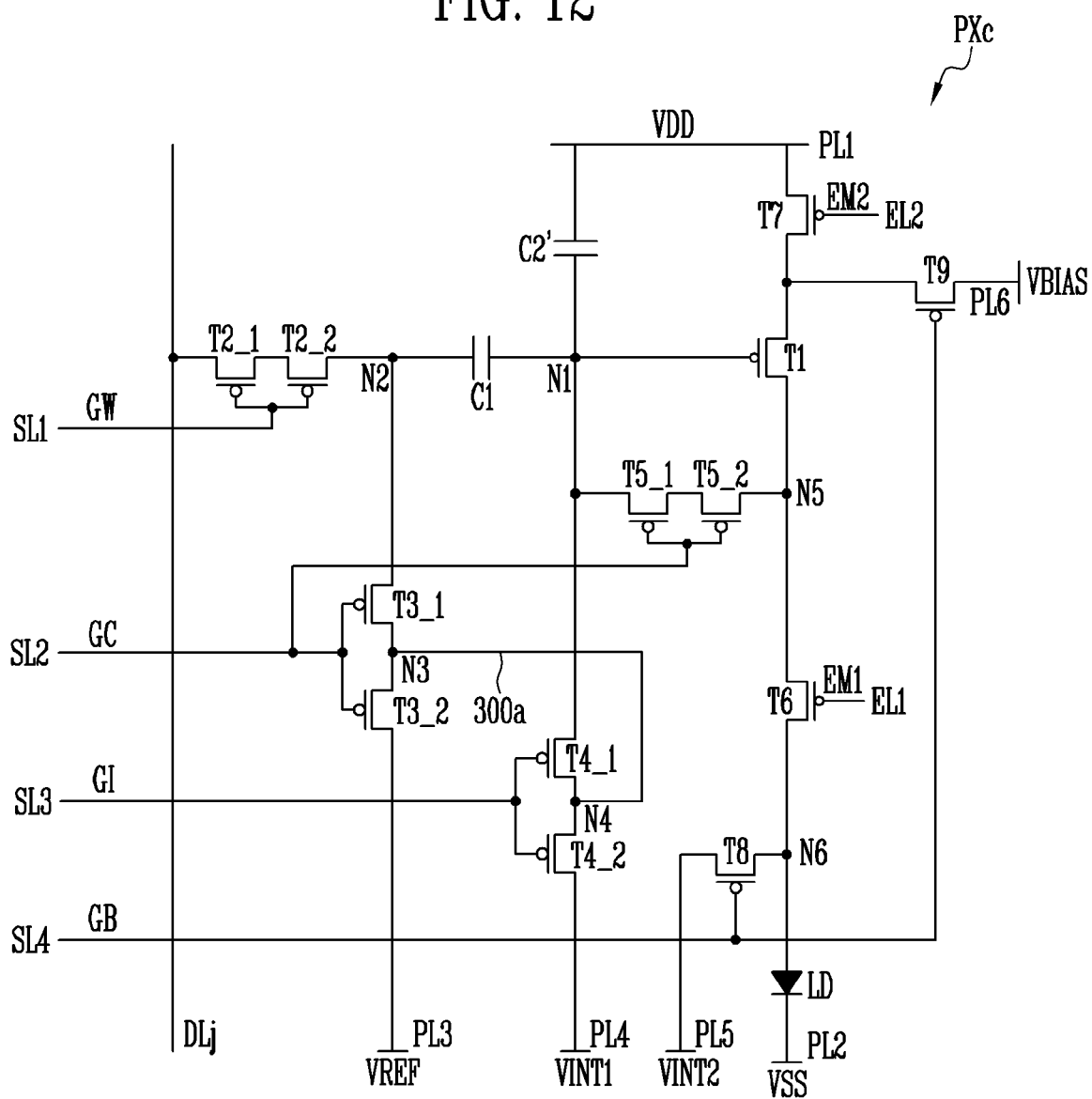

FIG. 12 is a circuit diagram illustrating a pixel PXc in accordance with another alternative embodiment of the disclosure. In the following description of FIG. 12, the same reference numerals will be used to designate the same components as those of FIG. 3, and any repetitive detailed description thereof will be omitted.

The configuration of the pixel PXc shown in FIG. 12 may be substantially the same as that of the pixel PX of FIG. 3 except that a second capacitor C2' is connected between the first power line PL1 and the first node N1. In such an embodiment, a substantial operation process of the pixel PXc is the same as that of the pixel PX of FIG. 3; therefore, any repetitive detailed description thereof will be omitted.

In a pixel and a display device including the pixel in accordance with embodiments of the disclosure, a current path extending from a data line to an anode electrode of a light emitting element may be formed during a test process, so that a defect of the pixel may be easily detected.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A pixel comprising:
a light emitting element;
a first transistor including a first electrode connected to a first power line, to which a voltage of a first power supply is supplied, wherein the first transistor controls, in response to a voltage of a first node connected to a gate electrode thereof, current flowing from the first power line to a second power line, to which a voltage of a second power supply is supplied, via the light emitting element;
a second transistor connected between a data line and a second node, wherein the second transistor is turned on when a first scan signal is supplied thereto through a first scan line;
a third transistor including a plurality of first sub-transistors connected in series via a third node between the second node and a third power line, to which a voltage of a reference power supply is supplied, wherein the plurality of first sub-transistors is turned on when a second scan signal is supplied thereto through a second scan line;
a fourth transistor including a plurality of second sub-transistors connected in series via a fourth node between the first node and a fourth power line, to which a voltage of a first initialization power supply is supplied, wherein the plurality of second sub-transistors is turned on when a third scan signal is supplied thereto through a third scan line:
a first capacitor connected between the first node and the second node; and
a connector directly connected to the third node and the fourth node,
wherein a current path is formed between the first node and the second node by the connector when the third transistor and the fourth transistor are simultaneously turned on.

2. The pixel according to claim 1, wherein the connector comprises a connection line electrically connected to the third node and the fourth node.

3. The pixel according to claim 1, wherein during a test process of the pixel, a turn-on period of the third transistor at least partially overlaps a turn-on period of the fourth transistor.

4. The pixel according to claim 1, further comprising:
a fifth transistor connected between the first node and a second electrode of the first transistor, wherein the fifth transistor is turned on when the second scan signal is supplied thereto;
a sixth transistor connected between the second electrode of the first transistor and an anode electrode of the light emitting element, wherein the sixth transistor is turned off when a first emission control signal is supplied thereto through a first emission control line;
a seventh transistor connected between the first power line and the first electrode of the first transistor, wherein the seventh transistor is turned off when a second emission control signal is supplied thereto through a second emission control line;
an eighth transistor connected between the anode electrode of the light emitting element and a fifth power line, to which a voltage of a second initialization power line is supplied, wherein the eighth transistor is turned on when a fourth scan signal is supplied thereto through a fourth scan line; and
a ninth transistor connected between the first electrode of the first transistor and a sixth power line, to which a voltage of a bias power supply is supplied, wherein the ninth transistor is turned on when the fourth scan signal is supplied thereto.

5. The pixel according to claim 4, wherein the voltage of the first initialization power supply and the voltage of the second initialization power supply are the same as each other.

6. The pixel according to claim 4, wherein each of the second transistor and the fifth transistor comprises a plurality of transistors connected in series to each other.

7. The pixel according to claim 1, further comprising:
a second capacitor connected between the first power line and the second node.

8. The pixel according to claim 1, further comprising:
a second capacitor connected between the first power line and the first node.

9. A display device comprising:
pixels connected to scan lines, emission control lines, data lines and power lines, wherein each of the pixels comprises:
a light emitting element;
a first transistor including a first electrode connected to a first power line, to which a voltage of a first power supply is supplied, wherein the first transistor controls, in response to a voltage of a first node connected to a gate electrode thereof, current flowing from the first power line to a second power line, to which a voltage of a second power supply is supplied, via the light emitting element;
a second transistor connected between a data line and a second node, wherein the second transistor is turned on when a first scan signal is supplied thereto through a first scan line;
a third transistor including a plurality of first sub-transistors connected in series via a third node between the second node and a third power line, to which a voltage of a reference power supply is supplied, wherein the plurality of first sub-transistors is turned on when a second scan signal is supplied thereto through a second scan line;
a fourth transistor including a plurality of second sub-transistors connected in series via a fourth node between the first node and a fourth power line, to which a voltage of a first initialization power supply is supplied, wherein the plurality of second sub-transistors is turned on when a third scan signal is supplied thereto through a third scan line;
a first capacitor connected between the first node and the second node; and
a connector directly connected to the third node and the fourth node, wherein a current path is formed between the first node and the second node by the connector when the third transistor and the fourth transistor are simultaneously turned on.

10. The display device according to claim 9, wherein the connector comprises a connection line electrically connected to the third node and the fourth node.

11. The display device according to claim 9, wherein each of the pixels further comprises:
- a fifth transistor connected between the first node and a second electrode of the first transistor, wherein the fifth transistor is turned on when the second scan signal is supplied thereto;
- a sixth transistor connected between the second electrode of the first transistor and an anode electrode of the light emitting element, wherein the sixth transistor is turned off when a first emission control signal is supplied thereto through a first emission control line;
- a seventh transistor connected between the first power line and the first electrode of the first transistor, wherein the seventh transistor is turned off when a second emission control signal is supplied thereto through a second emission control line;
- an eighth transistor connected between the anode electrode of the light emitting element and a fifth power line to which a voltage of a second initialization power line is supplied, wherein the eighth transistor is turned on when a fourth scan signal is supplied thereto through a fourth scan line; and
- a ninth transistor connected between the first electrode of the first transistor and a sixth power line to which a voltage of a bias power supply is supplied, wherein the ninth transistor is turned on when the fourth scan signal is supplied thereto.

12. The display device according to claim 9, wherein each of the pixels further comprises a second capacitor connected between the first power line and the second node or between the first power line and the first node.

* * * * *